(12) United States Patent
Kitamura et al.

(10) Patent No.: US 12,525,597 B2
(45) Date of Patent: Jan. 13, 2026

(54) SEMICONDUCTOR COMPOSITE DEVICE AND METHOD FOR MANUFACTURING SEMICONDUCTOR COMPOSITE DEVICE

(71) Applicant: Murata Manufacturing Co., Ltd., Nagaokakyo (JP)

(72) Inventors: Tatsuya Kitamura, Nagaokakyo (JP); Koshi Himeda, Nagaokakyo (JP); Takeshi Furukawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 469 days.

(21) Appl. No.: 18/064,558

(22) Filed: Dec. 12, 2022

(65) Prior Publication Data

US 2023/0109290 A1 Apr. 6, 2023

Related U.S. Application Data

(63) Continuation of application No. PCT/JP2021/031336, filed on Aug. 26, 2021.

(30) Foreign Application Priority Data

Sep. 1, 2020 (JP) .................. 2020-146929

(51) Int. Cl.
*H01L 23/498* (2006.01)
*H01L 21/48* (2006.01)
(Continued)

(52) U.S. Cl.
CPC ............ *H01L 25/18* (2013.01); *H01L 21/486* (2013.01); *H01L 23/49827* (2013.01);
(Continued)

(58) Field of Classification Search
CPC .............. H01L 23/49827; H01L 23/50; H01L 23/5384; H01L 23/5383; H01L 23/5385;
(Continued)

(56) References Cited

U.S. PATENT DOCUMENTS 9,167,702 B2  10/2015  Suzuki
2008/0304210 A1*  12/2008  Kasuga .................. H01G 9/012
361/528

(Continued)

FOREIGN PATENT DOCUMENTS

CN    111566811 A    8/2020
TW    1522025 B     2/2016
(Continued)

OTHER PUBLICATIONS

International Search Report in PCT/JP2021/031336, mailed on Nov. 9, 2021, 3 pages.

*Primary Examiner* — Omar F Mojaddedi
(74) *Attorney, Agent, or Firm* — ArentFox Schiff LLP

(57) ABSTRACT

A semiconductor composite device includes active elements and passive elements constituting a voltage regulator and disposed in association with a plurality of channels, a load to be supplied with a direct-current voltage regulated by the voltage regulator, and a wiring board electrically connected to the active elements, the passive elements, and the load. A plurality of capacitors disposed in the channels include an integrally formed capacitor array including a plurality of capacitor portions disposed in a plane. The capacitor array includes a plurality of through hole conductors extending through the capacitor array in a direction perpendicular to a mounting surface of the wiring board. At least a part of the capacitor array is positioned to overlap the load when viewed from the mounting surface of the wiring board.

15 Claims, 21 Drawing Sheets

(51) Int. Cl.
*H01L 23/538* (2006.01)
*H01L 23/64* (2006.01)
*H01L 25/16* (2023.01)
*H01L 25/18* (2023.01)
*H02M 3/04* (2006.01)
*H05K 3/46* (2006.01)
*H10D 1/20* (2025.01)
*H10D 1/68* (2025.01)

(52) U.S. Cl.
CPC ............... *H10D 1/20* (2025.01); *H10D 1/68* (2025.01); *H02M 3/04* (2013.01)

(58) Field of Classification Search
CPC ..... H01L 23/642; H01L 23/645; H01L 25/18; H01L 25/071; H01L 25/112; H01L 25/16; H02M 3/04; H02M 3/003; H02M 3/1584; H10D 1/20; H10D 1/68; H05K 3/46
See application file for complete search history.

(56) References Cited

U.S. PATENT DOCUMENTS

| | | | |
|---|---|---|---|
| 2011/0050334 A1* | 3/2011 | Pan | H01L 23/642 327/540 |
| 2013/0063843 A1* | 3/2013 | Chen | H01L 23/49811 361/56 |
| 2013/0074332 A1* | 3/2013 | Suzuki | H05K 1/185 29/834 |
| 2015/0181722 A1 | 6/2015 | Suzuki | |
| 2019/0304915 A1* | 10/2019 | Jain | H01L 23/147 |
| 2019/0341844 A1 | 11/2019 | Singh et al. | |
| 2020/0006232 A1* | 1/2020 | Pietambaram | H01L 23/562 |
| 2020/0321323 A1 | 10/2020 | Himeda et al. | |
| 2021/0375841 A1 | 12/2021 | Himeda et al. | |

FOREIGN PATENT DOCUMENTS

| | | |
|---|---|---|
| TW | 202005244 A | 1/2020 |
| WO | 2019130746 A1 | 7/2019 |

* cited by examiner

FIG. 17
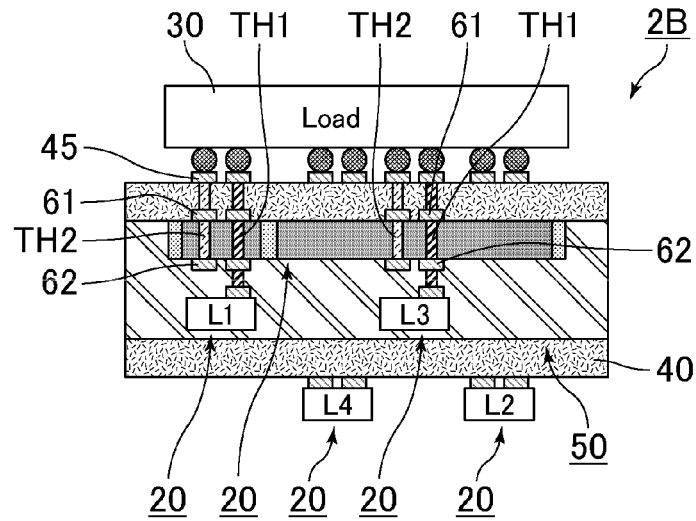
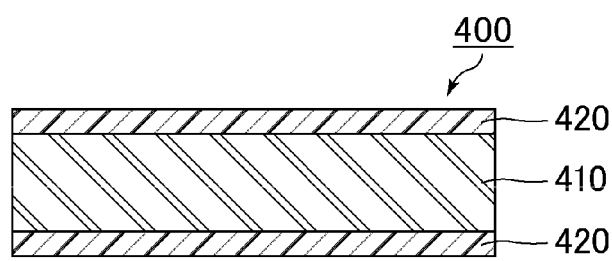
FIG. 18A
FIG. 18B  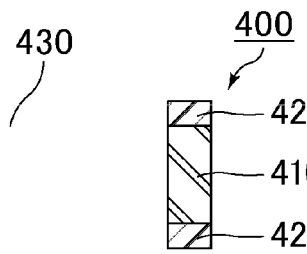
FIG. 19
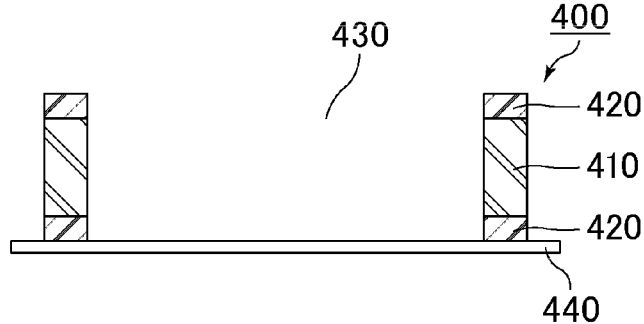

SEMICONDUCTOR COMPOSITE DEVICE AND METHOD FOR MANUFACTURING SEMICONDUCTOR COMPOSITE DEVICE

CROSS REFERENCE TO RELATED APPLICATIONS

This application is a continuation of PCT Application No. PCT/JP2021/031336, filed Aug. 26, 2021, which claims priority to Japanese Patent Application No. 2020-146929, filed Sep. 1, 2020, the entire contents of each of which are hereby incorporated in their entirety.

TECHNICAL FIELD

Aspects of the present disclosure are directed to a semiconductor composite device and a method for manufacturing the semiconductor composite device.

BACKGROUND OF THE INVENTION

U.S. Patent Application Publication No. 2011/0050334 ("U.S. '334") discloses a semiconductor device including a packaging substrate into which a passive element (passive device) such as an inductor or a capacitor is partially or completely embedded, and a voltage controller including an active element (active device) such as a switching element. In the semiconductor device described in U.S. '334, the voltage controller and a load to be supplied with a power supply voltage are mounted on the packaging substrate. A direct-current voltage regulated by a voltage regulator is smoothed by the passive element in the packaging substrate and supplied to the load.

SUMMARY OF INVENTION

The semiconductor device including the voltage controller as described in U.S. '334 is applied to electronic devices such as mobile phones and smartphones. In recent years, the electronic devices have been downsized and thinned and, along with it, there is a demand for downsizing of the semiconductor device per se. Further, a power supply circuit portion of a high-performance mobile terminal typified by a smartphone uses, for example, a multi-channel DC-DC converter IC (Integrated Circuit) or a PMIC (Power Management Integrated Circuit) having a low-power consumption function. In those ICs, increase in the drive speed and reduction in the power consumption have been progressed by low voltage and large current.

FIG. 1 is a plan view schematically illustrating an example of a semiconductor composite device constituting a multi-channel power supply. FIG. 1 illustrates an example of two channels.

A semiconductor composite device 100 illustrated in FIG. 1 includes active elements 10 and passive elements 20 constituting a voltage regulator, a load 30 to be supplied with a direct-current voltage regulated by the voltage regulator, and a wiring board 40 electrically connected to the active elements 10, the passive elements 20, and the load 30.

The active elements 10 and the passive elements 20 are disposed for individual channels. A first channel CH1 constitutes a single-phase power supply including a single power supply circuit. A second channel CH2 constitutes a multi-phase power supply including a plurality of power supply circuits connected in parallel.

The active elements 10 constituting the voltage regulator include switching elements SW1, SW2, SW3, and SW4. Of those switching elements, the switching element SW1 is disposed in the first channel CH1, and the switching elements SW2, SW3, and SW4 are disposed in the second channel CH2.

The passive elements 20 constituting the voltage regulator include output capacitors C1 and C2. Of those output capacitors, the output capacitor C1 is disposed in the first channel CH1, and the output capacitor C2 is disposed in the second channel CH2. For simplification of description, voltage smoothing capacitors adapted to switching frequencies of the switching elements are exemplified as the output capacitors described herein, but decoupling capacitors for reducing noise and short-circuiting high frequencies may be connected in shunt with output lines for the individual channels, and those capacitors may be connected in parallel.

The passive elements 20 constituting the voltage regulator further include inductors L1, L2, L3, and L4. Of those inductors, the inductor L1 is disposed in the first channel CH1, and the inductors L2, L3, and L4 are disposed in the second channel CH2.

The passive elements 20 constituting the voltage regulator include at least the output capacitors C1 and C2, and may not include the inductors L1, L2, L3, and L4.

If the capacitors such as the output capacitors are disposed on one mounting surface of the wiring board as in the semiconductor composite device 100 illustrated in FIG. 1, a mounting area may be required to dispose the capacitors. Therefore, it is difficult to downsize the semiconductor composite device. Since the capacitors are disposed for the individual channels, the mounting area increases as the number of channels increases.

If the connection distance from the capacitor such as the output capacitor to the load increases, loss caused by equivalent series inductance (ESL) and equivalent series resistance (ESR) increases due to an inductor component and a resistance component from the wiring. Therefore, the capacitor is desirably disposed near the load.

The present disclosure has an object to provide a semiconductor composite device that can be downsized and has a short connection distance from a capacitor to a load. Further, the present disclosure has an object to provide a method for manufacturing the semiconductor composite device.

Accordingly, it is an object of the present disclosure to provide a semiconductor composite device including active elements and passive elements constituting a voltage regulator and disposed in association with a plurality of channels, a load to be supplied with a direct-current voltage regulated by the voltage regulator and including a semiconductor element, and a wiring board electrically connected to the active elements, the passive elements, and the load. The active elements constituting the voltage regulator include switching elements. The passive elements constituting the voltage regulator include capacitors. A plurality of the capacitors disposed in the channels include an integrally formed capacitor array including a plurality of capacitor portions disposed in a plane. The capacitor array includes a plurality of through hole conductors extending through the capacitor array in a direction perpendicular to a mounting surface of the wiring board. At least a part of the capacitor array is positioned to overlap the load when viewed from the mounting surface of the wiring board.

In the semiconductor composite device of the present disclosure, the passive elements constituting the voltage regulator include, for example, a capacitor for driving a power supply. There may be a channel in which the power supply is driven by a capacitor other than the integrally formed capacitor array. The plurality of capacitors in the capacitor array may be connected in parallel to the same channel. Any other capacitor may be connected in parallel to the capacitor array.

A method for manufacturing the semiconductor composite device according to the present disclosure is a method for manufacturing the semiconductor composite device including the capacitor array embedded in the wiring board. The method includes a step of forming a cavity in a wiring board, a step of disposing a capacitor array in the cavity, a step of electrically connecting the wiring board and the capacitor array, and a step of embedding the capacitor array into the wiring board by sealing the cavity.

According to the present disclosure, it is possible to provide the semiconductor composite device that can be downsized and has a short connection distance from the capacitor to the load.

Additional advantages and novel features of the system of the present disclosure will be set forth in part in the description that follows, and in part will become more apparent to those skilled in the art upon examination of the following or upon learning by practice of the disclosure.

BRIEF DESCRIPTION OF THE DRAWINGS

In the descriptions that follow, like parts are marked throughout the specification and drawings with the same numerals, respectively. The drawings are not necessarily drawn to scale and certain drawings may be shown in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings.

FIG. 17 is a cross-sectional view schematically illustrating still another example of the semiconductor composite device in accordance with aspects of the present disclosure.

FIG. 18A and FIG. 18B are cross-sectional views schematically illustrating an example of a step of forming a cavity in a wiring board.

FIG. 19 is a cross-sectional view schematically illustrating an example of a step of applying a tape to the wiring board.

DETAILED DESCRIPTION

A semiconductor composite device and a method for manufacturing the semiconductor composite device according to the present disclosure are described below.

The present disclosure is not limited to the following structures, and may be applied by being modified as appropriate without departing from the spirit of the present disclosure. The present disclosure encompasses a combination of two or more individual desirable structures of the present disclosure to be described below.

The semiconductor composite device of the present disclosure includes active elements and passive elements constituting a voltage regulator and disposed in association with a plurality of channels, a load to be supplied with a direct-current voltage regulated by the voltage regulator, and a wiring board electrically connected to the active elements, the passive elements, and the load. The active elements constituting the voltage regulator include switching elements. The passive elements constituting the voltage regulator include capacitors.

In the semiconductor composite device of the present disclosure, the passive elements constituting the voltage regulator include, for example, a capacitor for driving a power supply. The capacitor for driving the power supply may be an output-side capacitor or an input-side capacitor. The semiconductor composite device of the present disclosure may include one or both of the output-side capacitor and the input-side capacitor as the capacitor for driving the power supply.

The following aspects are illustrative and components described in different aspects may partially be replaced or combined. In different aspects, description of matters in common with those aspects described above are omitted and differences are described. In particular, similar operations and advantages of similar components are not mentioned again.

The drawings referenced below are schematic drawings, and the dimensions, the scale of lengths and widths, and the like may be different from those in actual products.

Figure 2:
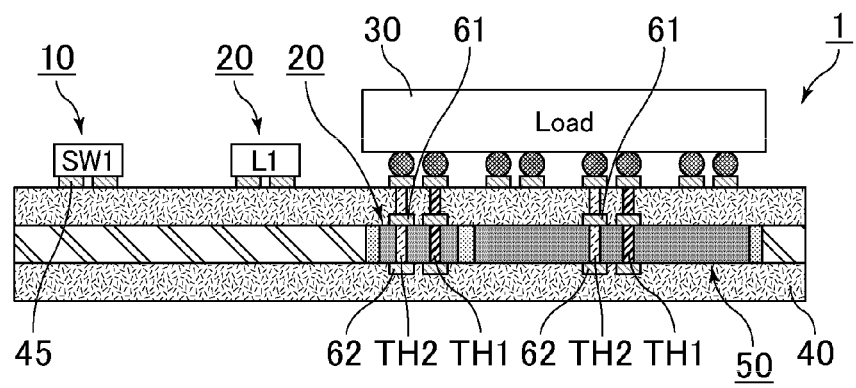
FIG. 2 is a cross-sectional view schematically illustrating an example of a semiconductor composite device in accordance with aspects of the present disclosure.
Figure 3:
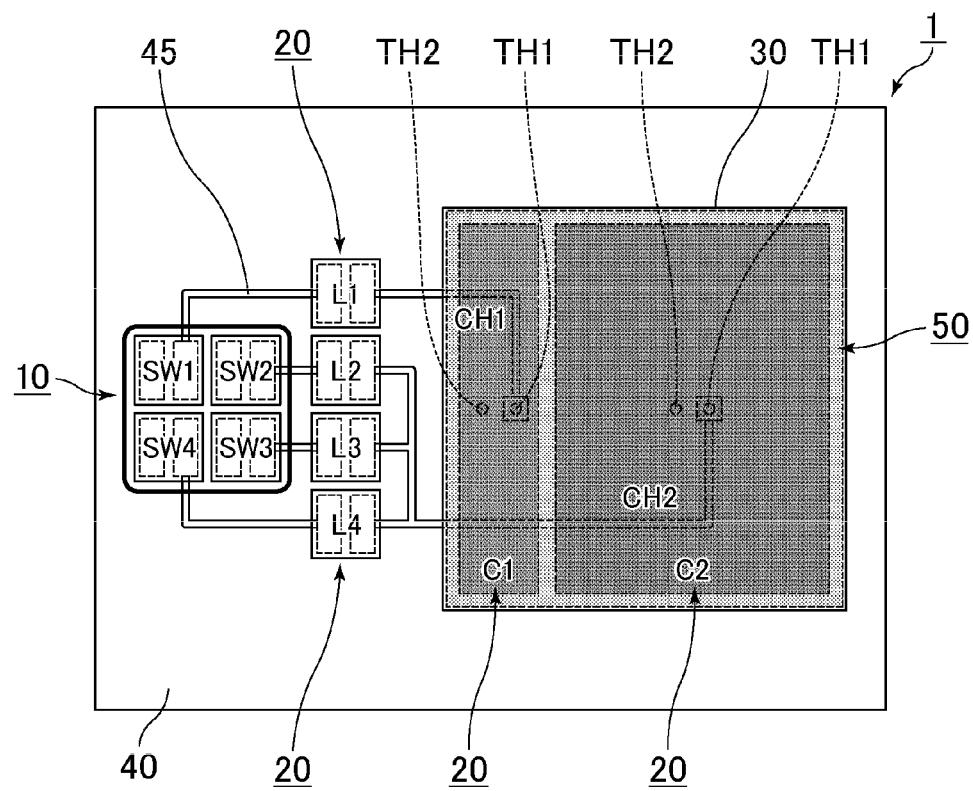
FIG. 3 is a plan view of the semiconductor composite device illustrated in FIG. 2 that is viewed from one mounting surface of a wiring board.
Figure 4:
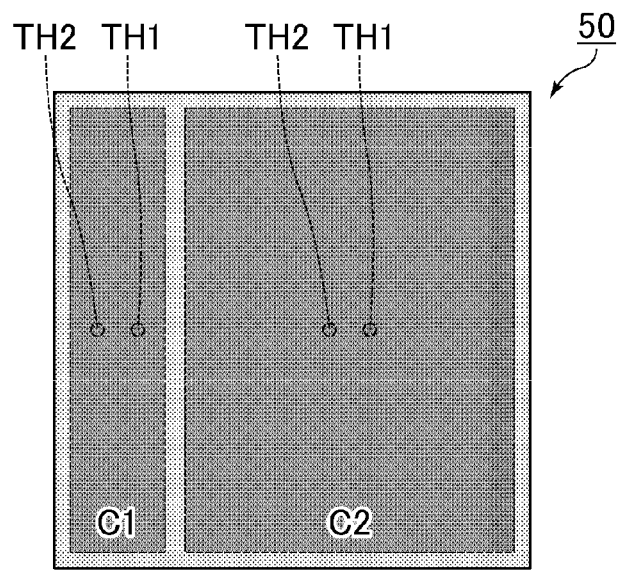
FIG. 4 is a plan view schematically illustrating an example of a capacitor array constituting the semiconductor composite device illustrated in FIG. 2 and FIG. 3.
Figure 5:
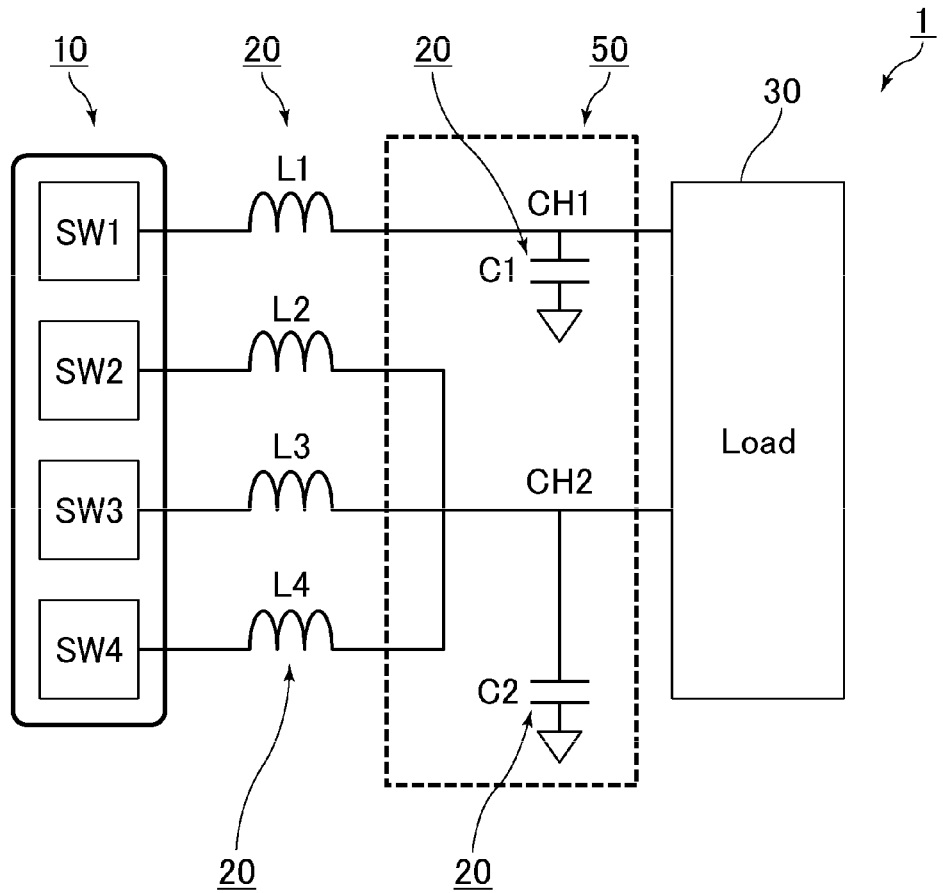
FIG. 5 is a circuit structure diagram of the semiconductor composite device illustrated in FIG. 2 and FIG. 3.

FIG. 2 is a cross-sectional view schematically illustrating an example of a semiconductor composite device in accordance with aspects of the present disclosure. FIG. 3 is a plan view of the semiconductor composite device illustrated in FIG. 2 that is viewed from one mounting surface of a wiring board. FIG. 4 is a plan view schematically illustrating an example of a capacitor array constituting the semiconductor composite device illustrated in FIG. 2 and FIG. 3. FIG. 5 is a circuit structure diagram of the semiconductor composite device illustrated in FIG. 2 and FIG. 3. FIG. 3 illustrates an example of two channels, but the number of channels may be three or more.

A semiconductor composite device 1 illustrated in FIG. 2 and FIG. 3 includes active elements 10 and passive elements 20 constituting a voltage regulator, a load 30 to be supplied with a direct-current voltage regulated by the voltage regulator, and a wiring board 40 electrically connected to the active elements 10, the passive elements 20, and the load 30.

The active elements 10 and the passive elements 20 are disposed for individual channels. A first channel CH1 constitutes a single-phase power supply including a single power supply circuit. A second channel CH2 constitutes a multi-phase power supply including a plurality of power supply circuits connected in parallel. In the second channel CH2, a multi-phase power supply including three power supply circuits connected in parallel is described as an example, but the number of power supply circuits connected in parallel is not particularly limited.

Both the first channel CH1 and the second channel CH2 may constitute single-phase power supplies. Alternatively, both the first channel CH1 and the second channel CH2 may constitute multi-phase power supplies. In this case, the numbers of power supply circuits connected in parallel may be equal to or different from each other.

The active elements 10 constituting the voltage regulator include switching elements SW1, SW2, SW3, and SW4. Of those switching elements, the switching element SW1 is disposed in the first channel CH1, and the switching elements SW2, SW3, and SW4 are disposed in the second channel CH2.

In the example illustrated in FIG. 2 and FIG. 3, the switching element SW1 disposed in the first channel CH1 and the switching elements SW2, SW3, and SW4 disposed in the second channel CH2 are disposed on one mounting surface of the wiring board 40.

Figure 1:
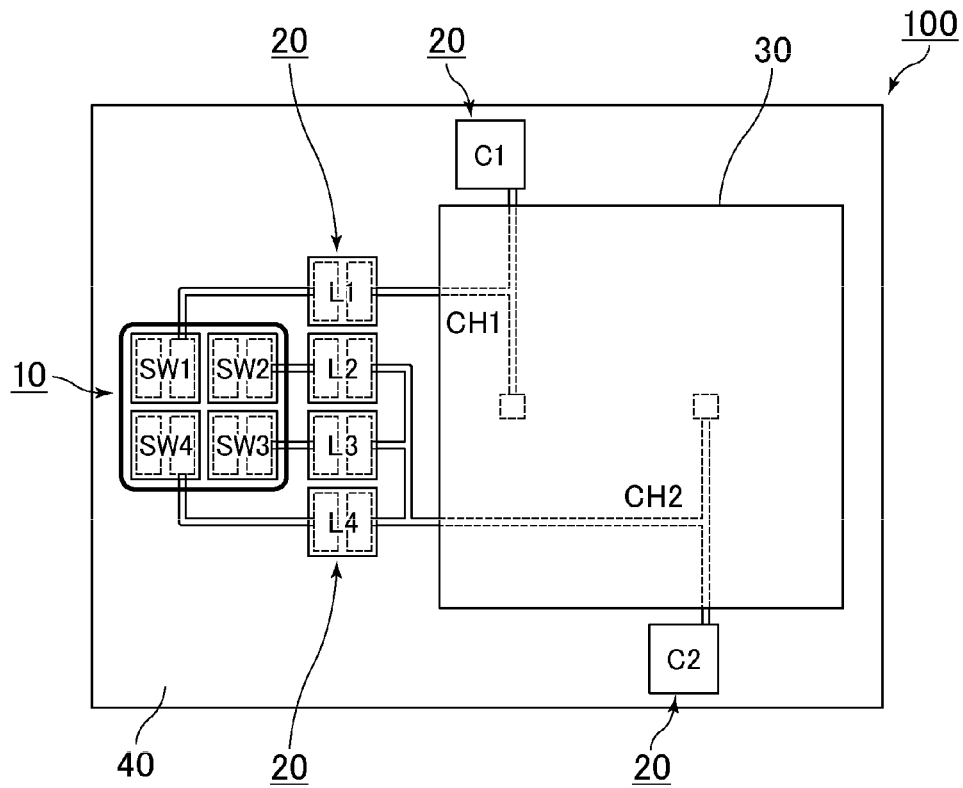
FIG. 1 is a plan view schematically illustrating an example of a semiconductor composite device constituting a multi-channel power supply.

The passive elements 20 constituting the voltage regulator include output capacitors C1 and C2. Of those output capacitors, the output capacitor C1 is disposed in the first channel CH1, and the output capacitor C2 is disposed in the second channel CH2. Similarly to FIG. 1, voltage smoothing capacitors adapted to switching frequencies of the switching elements are exemplified as the output capacitors described herein for simplification of description, but decoupling capacitors for reducing noise and short-circuiting high frequencies may be connected in shunt with output lines for the individual channels, and those capacitors may be connected in parallel. The same applies to the following figures.

The output capacitors C1 and C2 are examples of capacitors for stably driving the power supply, and are output capacitors for smoothing an output voltage. As illustrated in FIG. 2, FIG. 3, and FIG. 4, the output capacitor C1 disposed in the first channel CH1 and the output capacitor C2 disposed in the second channel CH2 are defined by an integrally formed capacitor array 50 including a plurality of capacitor portions disposed in a plane. The size of the capacitor portion constituting the output capacitor C1 may be equal to or different from the size of the capacitor portion constituting the output capacitor C2.

The capacitor array 50 includes a plurality of through hole conductors TH1 and TH2 extending through the capacitor array 50 in a direction perpendicular to the mounting surface of the wiring board 40. A first connection terminal 61 is formed at one end portion of the through hole conductor TH1 or TH2. A second connection terminal 62 is formed at the other end portion of the through hole conductor TH1 or TH2.

As illustrated in FIG. 2 and FIG. 3, at least a part of the capacitor array 50 is positioned to overlap the load 30 when viewed from the mounting surface of the wiring board 40. In the example illustrated in FIG. 2 and FIG. 3, the capacitor array 50 is embedded in the wiring board 40.

The passive elements 20 constituting the voltage regulator further include inductors L1, L2, L3, and L4. Of those inductors, the inductor L1 is disposed in the first channel CH1, and the inductors L2, L3, and L4 are disposed in the second channel CH2. The inductor L1 is connected between the switching element SW1 and the load 30. The inductor L2 is connected between the switching element SW2 and the load 30. The inductor L3 is connected between the switching element SW3 and the load 30. The inductor L4 is connected between the switching element SW4 and the load 30.

In the example illustrated in FIG. 2 and FIG. 3, the inductor L1 disposed in the first channel CH1 and the inductors L2, L3, and L4 disposed in the second channel CH2 are disposed on the one mounting surface of the wiring board 40.

The passive elements 20 constituting the voltage regulator include at least the output capacitors C1 and C2, and may not include the inductors L1, L2, L3, and L4.

The load 30 includes a semiconductor element. Examples of the load 30 include a semiconductor integrated circuit (IC) such as a logical operation circuit or a storage circuit.

In the example illustrated in FIG. 2 and FIG. 3, the load 30 is disposed on the one mounting surface of the wiring board 40.

A circuit layer 45 including lands for mounting the components such as the switching elements SW1, SW2, SW3, and SW4, the inductors L1, L2, L3, and L4, and the load 30 and wires for connecting the components is formed on the one mounting surface of the wiring board 40. The wiring board 40 is electrically connected to the active elements 10, the passive elements 20, and the load 30 via the circuit layer 45.

Although illustration is omitted, electronic devices such as a choke inductor, a surge protection diode element, and a voltage dividing resistance element may be disposed on the mounting surface of the wiring board 40 in addition to the active elements 10, the passive elements 20, and the load 30.

In the example illustrated in FIG. 2 and FIG. 3, the semiconductor composite device having two channels is described. In the semiconductor composite device in accordance with aspects of the present disclosure, however, the number of channels is not particularly limited as long as the number of channels is two or more.

The semiconductor composite device in accordance with aspects of the present disclosure has a feature in that the plurality of capacitors such as the output capacitors disposed in the channels include the integrally formed capacitor array including the plurality of capacitor portions disposed in the plane, the capacitor array includes the plurality of through hole conductors extending through the capacitor array in the direction perpendicular to the mounting surface of the wiring board, and at least a part of the capacitor array is positioned to overlap the load when viewed from the mounting surface of the wiring board.

In accordance with aspects of the present disclosure, the plurality of capacitors are not disposed in the same plane as that of the load because the semiconductor composite device has the feature described above. Thus, the mounting area can be reduced. As a result, the semiconductor composite device can be downsized.

Since the wiring from each capacitor to the load need not be laid in the same plane, the connection distance from the capacitor to the load can be shortened. As a result, the inductor component and the resistance component from the wiring can be reduced.

In the semiconductor composite device in accordance with aspects of the present disclosure, the integrally formed capacitor array may be connected to one channel out of the plurality of channels, but may be connected to two or more channels. In the semiconductor composite device in accordance with aspects of the present disclosure, the plurality of capacitors disposed in all the channels may be defined by the integrally formed capacitor array alone. Alternatively, there may be a channel in which the power supply is stably driven by a capacitor other than the integrally formed capacitor array, the plurality of capacitors in the capacitor array may be connected in parallel to the same channel, or any other capacitor may be connected in parallel to the capacitor array.

In the example illustrated in FIG. 2 and FIG. 3, description is made about the semiconductor composite device in which the first channel CH1 constitutes the single-phase power supply and the second channel CH2 constitutes the multi-phase power supply. In the semiconductor composite device in accordance with aspects of the present disclosure, however, all the channels may constitute single-phase power supplies, all the channels may constitute multi-phase power supplies, or the channel constituting the single-phase power supply and the channel constituting the multi-phase power supply may be mixed together. In a case of a plurality of channels constituting multi-phase power supplies, the numbers of power supply circuits connected in parallel may be equal or different among the channels.

In the semiconductor composite device in accordance with aspects of the present disclosure, the through hole conductor is formed on at least the inner wall surface of a through hole extending through the capacitor array from the top to the bottom in its thickness direction. The inner wall surface of the through hole is metalized with a low-resistance metal such as Cu, Au, or Ag. To facilitate the process, the inner wall surface may be metalized by, for example, electroless Cu plating or electrolytic Cu plating. The metalization of the through hole conductor is not limited to metalization of the inner wall surface of the through hole, and may be filling with a metal or a composite material of a metal and a resin.

The through hole conductors are classified into A. a through hole conductor for a positive terminal of a capacitor, B. a through hole conductor for a negative terminal of a capacitor and for a ground, and C. a through hole conductor for an I/O line. A. The through hole conductor for a positive terminal of a capacitor is connected to the positive terminal of the capacitor. B. The through hole conductor for a negative terminal of a capacitor and for a ground is connected to the negative terminal of the capacitor. C. The through hole conductor for an I/O line is not connected to the positive terminal or the negative terminal of the capacitor.

In the case of A. the through hole conductor for a positive terminal of a capacitor, a space between the through hole extending through the capacitor and the through hole conductor may be or may not be filled with an insulating material. In the latter case, the structure is such that a core portion of a positive terminal plate that is the positive terminal of the capacitor as described below is directly connected to the through hole conductor. In the case of B. the through hole conductor for a negative terminal of a capacitor and for a ground and C. the through hole conductor for an I/O line, a space between the through hole extending through the capacitor and the through hole conductor is filled with an insulating material.

In the semiconductor composite device according to aspects of the present disclosure, at least one through hole conductor out of the through hole conductors extending through the capacitor array is connected to a positive terminal of a capacitor such as the output capacitor.

Figure 6:
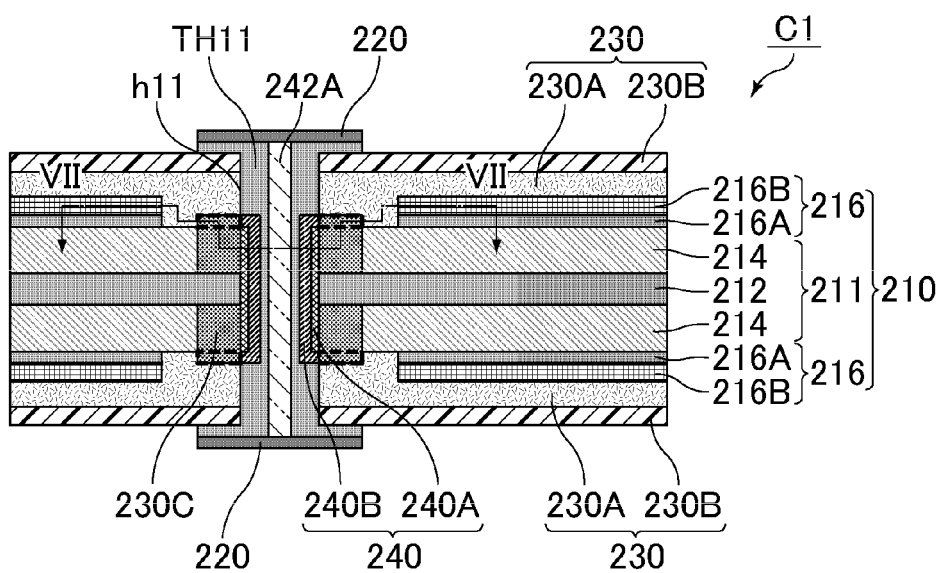
FIG. 6 is a cross-sectional view schematically illustrating an example of a through hole conductor connected to a positive terminal of a capacitor and the periphery of the through hole conductor.
Figure 7:
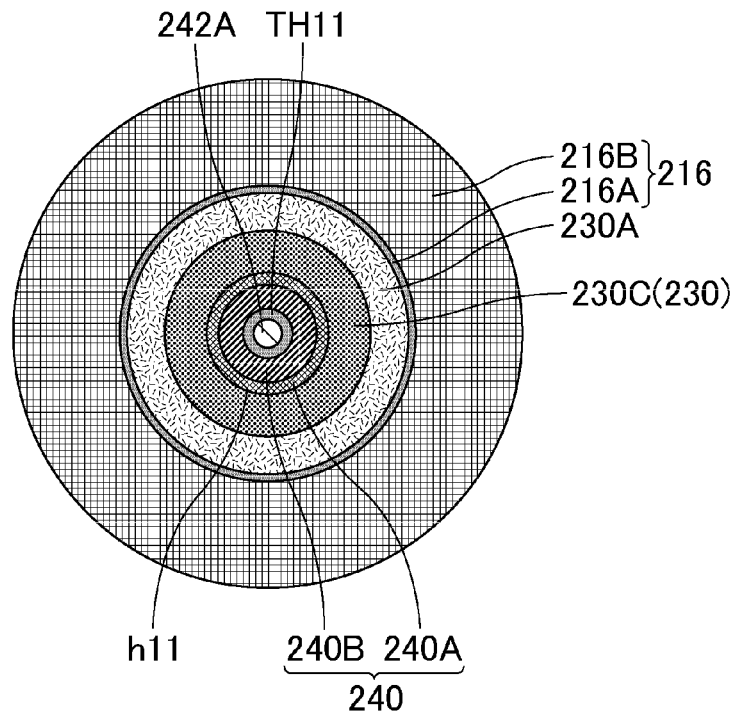
FIG. 7 is a projected cross-sectional view taken along the line VII-VII in FIG. 6.

FIG. 6 is a cross-sectional view schematically illustrating an example of the through hole conductor connected to the positive terminal of the capacitor and the periphery of the through hole conductor. FIG. 7 is a projected cross-sectional view taken along the line VII-VII in FIG. 6. In FIG. 6 and FIG. 7, description is made about a first through hole conductor TH11 connected to a positive terminal of the output capacitor C1.

The output capacitor C1 illustrated in FIG. 6 includes a capacitor portion 210, conductive portions 220 electrically connected to the first through hole conductor TH11, and insulating portions 230 laminated on the surfaces of the capacitor portion 210. The conductive portions 220 are formed on the surfaces of the first through hole conductor TH11, and can function as connection terminals. As illustrated in FIG. 6, each insulating portion 230 may include a first insulating portion 230A laminated on the surface of the capacitor portion 210, and a second insulating portion 230B laminated on the surface of the first insulating portion 230A.

In this aspect, the capacitor portion 210 includes a positive terminal plate 211 made of a metal. For example, the positive terminal plate 211 includes a core portion 212 made of a valve-action metal. The positive terminal plate 211 may include a porous portion 214 provided on at least one principal surface of the core portion 212. A dielectric layer (not illustrated) is provided on the surface of the porous portion 214, and a negative terminal layer 216 is provided on the surface of the dielectric layer. Accordingly, the capacitor portion 210 in this aspect serves as an electrolytic capacitor. FIG. 6 illustrates a carbon layer 216A and a copper layer 216B that are conductor layers as the negative terminal layer 216. Although illustration is omitted in FIG. 6, a solid electrolyte layer is provided on the surface of the dielectric layer as the negative terminal layer 216, and the conductor layers are provided on the surface of the solid electrolyte layer.

If the capacitor portion 210 serves as the electrolytic capacitor, the positive terminal plate 211 is made of the so-called valve-action metal exhibiting a valve action. Examples of the valve-action metal include a single metal such as aluminum, tantalum, niobium, titanium, or zirconium, and an alloy containing at least one kind of those metals. Of those metals, aluminum or an aluminum alloy may be implemented. An electrolytic capacitor including aluminum or an aluminum alloy as a base material is hereinafter referred to also as "aluminum element".

The shape of the positive terminal plate 211 may be a flat-plate shape, and more may be a foil shape. The positive terminal plate 211 includes the porous portion 214 on at least one principal surface of the core portion 212, and may include porous portions 214 on both the principal surfaces of the core portion 212. The porous portion 214 may be a porous layer formed on the surface of the core portion 212, and may be an etched layer.

The dielectric layer provided on the surface of the porous portion 214 is porous by reflecting the state of the surface of the porous portion 214, and has a surface shape with fine asperities. The dielectric layer may be an oxide film of the valve-action metal described above. For example, in a case where aluminum foil is used as the positive terminal plate 211, the dielectric layer can be formed from the oxide film by performing positive terminal oxidation (referred to also as "chemical conversion") on the surface of the aluminum foil in an aqueous solution containing ammonium adipate or the like.

The negative terminal layer 216 provided on the surface of the dielectric layer includes, for example, the solid electrolyte layer provided on the surface of the dielectric layer. Further, the negative terminal layer 216 may include the conductor layers provided on the surface of the solid electrolyte layer.

Examples of the material for the solid electrolyte layer include conductive polymers such as polypyrroles, polythiophenes, and polyanilines. Of those materials, polythiophenes may be implemented, and poly(3,4-ethylenedioxythiophene) called PEDOT may be implemented. The conductive polymers may contain a dopant such as polystyrene sulfonate (PSS). The solid electrolyte layer may include an inner layer that fills pores (recesses) of the dielectric layer, and an outer layer that covers the dielectric layer.

The conductor layers include at least one layer out of a conductive resin layer and a metal layer. The conductor layer may be the conductive resin layer alone or the metal layer alone. The conductor layer may cover the entire solid electrolyte layer.

Examples of the conductive resin layer include a conductive adhesive layer containing at least one kind of conductive filler selected from the group consisting of silver filler, copper filler, nickel filler, and carbon filler.

Examples of the metal layer include a metal-plated film and metal foil. The metal layer may be formed from at least one kind of metal selected from the group consisting of nickel, copper, silver, and alloys containing those metals as a main component. The term "main component" refers to an elemental component having the largest element weight ratio.

For example, the conductor layers include the carbon layer provided on the surface of the solid electrolyte layer, and the copper layer provided on the surface of the carbon layer.

The carbon layer is provided to electrically and mechanically connect the solid electrolyte layer and the copper layer. The carbon layer can be formed in a predetermined region by applying carbon paste onto the solid electrolyte layer by sponge transfer, screen printing, dispensing, inkjet printing, or the like.

The copper layer can be formed by applying copper paste onto the carbon layer by sponge transfer, screen printing, spraying, dispensing, inkjet printing, or the like.

The conductive portion 220 is mainly made of a low-resistance metal such as Ag, Au, or Cu. For the purpose of improving an adhesion force between layers, a conductive adhesive material obtained by mixing the conductive filler described above and a resin may be provided as the conductive portion.

The insulating portion 230 is made of an insulating material typified by a resin such as epoxy, phenol, or polyimide, or a material obtained by mixing a resin such as epoxy, phenol, or polyimide and inorganic filler such as silica or alumina.

As the capacitor portion 210, there may be used a ceramic capacitor using barium titanate, or a thin film capacitor using silicon nitride (SiN), silicon dioxide ($SiO_2$), hydrogen fluoride (HF), or the like. From the viewpoint of formation of a thinner capacitor portion 210 having a relatively large area and mechanical characteristics of the capacitor array 50, such as rigidity and flexibility, however, the capacitor portion 210 may be a capacitor using a metal such as aluminum as a base material, or may be an electrolytic capacitor using a metal such as aluminum as a base material, or may be an electrolytic capacitor using aluminum or an aluminum alloy as a base material.

The first through hole conductor TH11 is formed through the capacitor portion 210 in a thickness direction of the output capacitor C1. Specifically, the first through hole conductor TH11 is formed on at least the inner wall surface of a first through hole h11 extending through the capacitor portion 210 in the thickness direction.

As illustrated in FIG. 6 and FIG. 7, the first through hole conductor TH11 is connected to the end surface of the positive terminal plate 211. That is, the first through hole conductor TH11 is connected to the core portion 212 that is the positive terminal of the capacitor portion 210 at the end surface of the positive terminal plate 211.

By electrically connecting the first through hole conductor TH11 to the positive terminal of the capacitor portion 210, the output capacitor C1 can be downsized, and the semiconductor composite device can further be downsized. If the first through hole conductor TH11 is connected to the end surface of the positive terminal plate 211 in this case, a wiring function for connecting the top and the bottom of the output capacitor C1 and a function of connecting the positive terminal of the capacitor portion 210 to wiring can simultaneously be achieved through the first through hole conductor TH11. Therefore, the semiconductor composite device can be downsized. Further, the ESL and the ESR of the output capacitor C1 can be reduced by the decrease in the wiring length.

The core portion 212 and the porous portion 214 are exposed at the end surface of the positive terminal plate 211 connected to the first through hole conductor TH11. By filling the porous portion 214 with an insulating material, a third insulating portion 230C is provided around the first through hole conductor TH11 as illustrated in FIG. 6 and FIG. 7.

As illustrated in FIG. 6, the core portion 212 and the porous portion 214 may be exposed at the end surface of the positive terminal plate 211 connected to the first through hole conductor TH11. In this case, the contact area between the first through hole conductor TH11 and the porous portion 214 increases, thereby increasing the close contact level and reducing troubles such as peeling of the first through hole conductor TH11.

In the case where the core portion 212 and the porous portion 214 are exposed at the end surface of the positive terminal plate 211 connected to the first through hole conductor TH11, the insulating material may be present in a hollow part of the porous portion 214. That is, the third insulating portion 230C may be provided around the first through hole conductor TH11. By filling the porous portion 214 at a predetermined part around the first through hole conductor TH11 with the insulating material, the insulation between the core portion 212 of the positive terminal plate 211 and the negative terminal layer 216 can be secured and the short circuit can be prevented. Further, dissolution of the end surface of the positive terminal plate 211 that may be caused during chemical liquid treatment for forming the conductive portion 220 and the like can be suppressed. Therefore, entry of the chemical liquid into the capacitor portion 210 can be prevented and the reliability of the output capacitor C1 is improved.

From the viewpoint of increasing the advantages described above, the thickness of the third insulating portion 230C may be larger than the thickness of the porous portion 214 as illustrated in FIG. 6.

In the case where the core portion 212 and the porous portion 214 are exposed at the end surface of the positive terminal plate 211 connected to the first through hole conductor TH11, the insulating material may not be present in the hollow part of the porous portion 214. In this case, the hollow part of the porous portion 214 is exposed at the end surface of the positive terminal plate 211.

As illustrated in FIG. 6 and FIG. 7, it may be a positive terminal connection layer 240 provided between the first through hole conductor TH11 and the positive terminal plate 211 and the first through hole conductor TH11 be connected to the end surface of the positive terminal plate 211 via the positive terminal connection layer 240. By providing the positive terminal connection layer 240 between the first through hole conductor TH11 and the positive terminal plate 211, the positive terminal connection layer 240 functions as a barrier layer for the core portion 212 and the porous portion 214 of the positive terminal plate 211. As a result, the dissolution of the positive terminal plate 211 that may be caused during the chemical liquid treatment for forming the conductive portion 220 and the like can be suppressed. Therefore, the entry of the chemical liquid into the capacitor portion 210 can be prevented and the reliability of the output capacitor C1 is improved.

In the case where the positive terminal connection layer 240 is provided between the first through hole conductor TH11 and the positive terminal plate 211, the positive terminal connection layer 240 includes, for example, a first positive terminal connection layer 240A using Zn as a main material and a second positive terminal connection layer 240B using Ni or Cu as a main material in order from the positive terminal plate 211 as illustrated in FIG. 6 and FIG. 7. For example, the first positive terminal connection layer 240A is formed at the end surface of the positive terminal plate 211 by replacement deposition of Zn through zincate treatment, and then the second positive terminal connection layer 240B is formed on the first positive terminal connection layer 240A by electroless Ni plating or electroless Cu plating. The first positive terminal connection layer 240A may be lost. In this case, the positive terminal connection layer 240 may include the second positive terminal connection layer 240B.

In particular, the positive terminal connection layer 240 may include a layer using Ni as a main material. By using Ni for the positive terminal connection layer 240, damage to, for example, Al constituting the positive terminal plate 211 can be reduced and the barrier performance can be improved.

In the case where the positive terminal connection layer 240 is provided between the first through hole conductor TH11 and the positive terminal plate 211, the length of the positive terminal connection layer 240 in a direction in which the first through hole conductor TH11 extends may be larger than the length of the positive terminal plate 211 in the direction in which the first through hole conductor TH11 extends in a cross-sectional view in a direction orthogonal to the thickness direction as illustrated in FIG. 6. In this case, the core portion 212 and the porous portion 214 exposed at the end surface of the positive terminal plate 211 are completely covered with the positive terminal connection layer 240. Thus, the dissolution of the positive terminal plate 211 described above can further be suppressed.

In a plan view in the thickness direction as illustrated in FIG. 7, the first through hole conductor TH11 may be connected to the end surface of the positive terminal plate 211 over the entire circumference of the first through hole h11. In this case, the contact area between the first through hole conductor TH11 and the positive terminal plate 211 increases, thereby reducing the resistance of connection to the first through hole conductor TH11. Thus, the ESR of the output capacitor C1 can be reduced. Further, the close contact level between the first through hole conductor TH11 and the positive terminal plate 211 increases, thereby reducing troubles such as peeling at the connection surfaces due to thermal stress.

The first through hole h11 may be filled with a material containing a resin. That is, as illustrated in FIG. 6 and FIG. 7, a first resin-filling portion 242A may be provided in the first through hole h11. A gap is eliminated by filling the first through hole h11 with the resin material. Thus, it is possible to reduce the occurrence of delamination of the first through hole conductor TH11 formed on the inner wall surface of the first through hole h11.

The material that fills the first through hole h11 may have a larger thermal expansion coefficient than the material for the first through hole conductor TH11 (for example, copper). In this case, the material that fills the first through hole h11 is expanded under a high-temperature environment to push the first through hole conductor TH11 from the inner side portion to the outer side portion of the first through hole h11. Thus, the occurrence of delamination of the first through hole conductor TH11 can further be reduced.

The thermal expansion coefficient of the material that fills the first through hole h11 may be equal to the thermal expansion coefficient of the material for the first through hole conductor TH11, or may be smaller than the thermal expansion coefficient of the material for the first through hole conductor TH11.

In the semiconductor composite device according to aspects of the present disclosure, the inductor disposed in at least one channel may electrically be connected to the through hole conductor connected to the positive terminal of the capacitor such as the output capacitor. In this case, the inductors disposed in all the channels may be electrically connected to the through hole conductor connected to the positive terminal of the capacitor.

In the semiconductor composite device according to aspects of the present disclosure, at least one through hole conductor out of the through hole conductors extending through the capacitor array is connected to a negative terminal of the capacitor such as the output capacitor.

Figure 8:
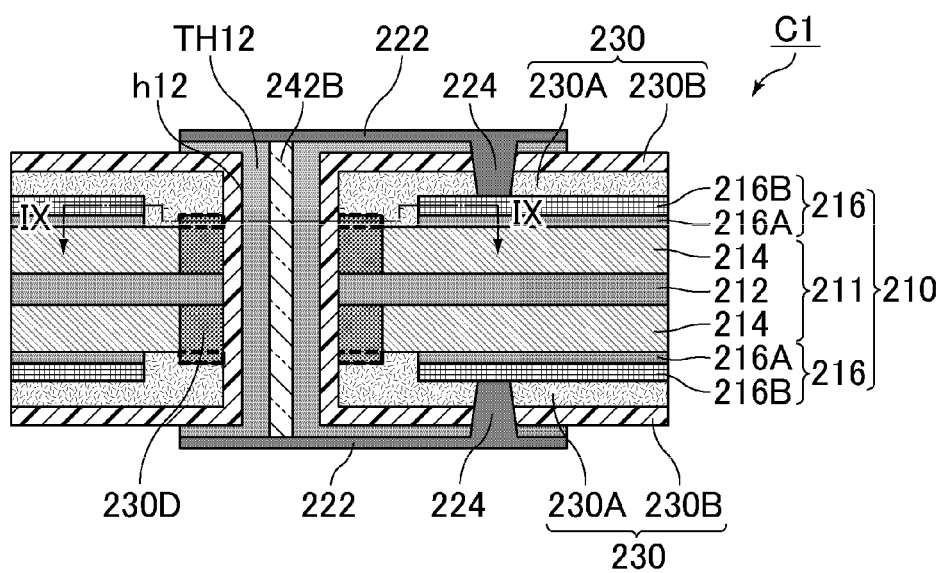
FIG. 8 is a cross-sectional view schematically illustrating an example of a through hole conductor connected to a negative terminal of the capacitor and the periphery of the through hole conductor.
Figure 9:
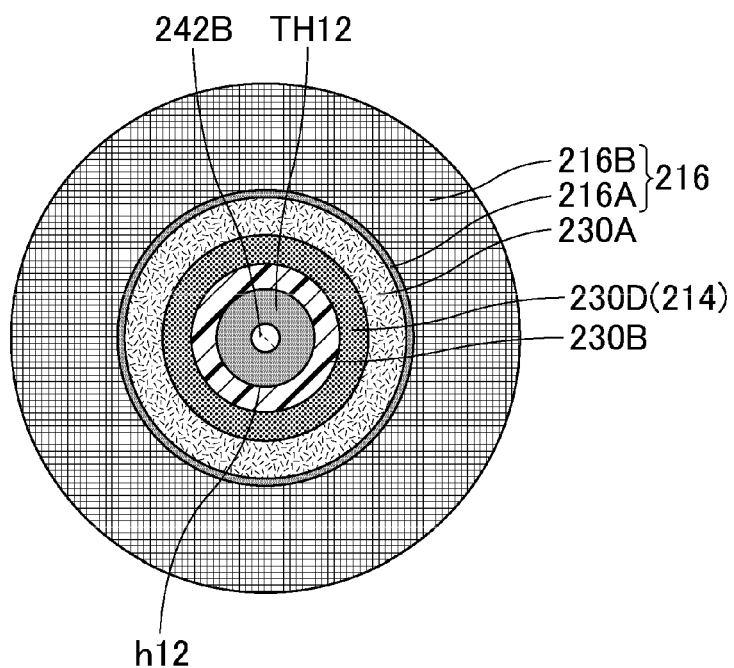
FIG. 9 is a projected cross-sectional view taken along the line IX-IX in FIG. 8.

FIG. 8 is a cross-sectional view schematically illustrating an example of the through hole conductor connected to the negative terminal of the capacitor and the periphery of the through hole conductor. FIG. 9 is a projected cross-sectional view taken along the line IX-IX in FIG. 8. In FIG. 8 and FIG. 9, description is made about a second through hole conductor TH12 connected to a negative terminal of the output capacitor C1.

The output capacitor C1 illustrated in FIG. 8 includes the capacitor portion 210, conductive portions 222 electrically connected to the second through hole conductor TH12, and the insulating portions 230 laminated on the surfaces of the capacitor portion 210. The conductive portions 222 are formed on the surfaces of the second through hole conductor TH12, and can function as connection terminals. As illustrated in FIG. 8, each insulating portion 230 may include the first insulating portion 230A laminated on the surface of the capacitor portion 210, and the second insulating portion 230B laminated on the surface of the first insulating portion 230A.

As described in FIG. 6, the capacitor portion 210 includes the positive terminal plate 211 made of a metal. For example, the positive terminal plate 211 includes the core portion 212 made of the valve-action metal. The positive terminal plate 211 may include the porous portion 214 provided on at least one principal surface of the core portion 212. The dielectric layer (not illustrated) is provided on the surface of the porous portion 214, and the negative terminal layer 216 is provided on the surface of the dielectric layer. Accordingly, the capacitor portion 210 in this aspect serves as the electrolytic capacitor.

The second through hole conductor TH12 is formed through the capacitor portion 210 in the thickness direction of the output capacitor C1. Specifically, the second through hole conductor TH12 is formed on at least the inner wall surface of a second through hole h12 extending through the capacitor portion 210 in the thickness direction.

As illustrated in FIG. 8, the second through hole conductor TH12 is electrically connected to the negative terminal layer 216 via the conductive portion 222 and a via conductor 224.

In the case where the insulating portion 230 includes the first insulating portion 230A and the second insulating portion 230B, the second insulating portion 230B may extend between the second through hole conductor TH12 and the positive terminal plate 211 as illustrated in FIG. 8 and FIG. 9. With the second insulating portion 230B present between the second through hole conductor TH12 and the positive terminal plate 211, the insulation between the second through hole conductor TH12 and the core portion 212 of the positive terminal plate 211 can be secured.

The core portion 212 and the porous portion 214 are exposed at the end surface of the positive terminal plate 211 in contact with the second insulating portion 230B. By filling the porous portion 214 with an insulating material, a fourth insulating portion 230D is provided around the second through hole conductor TH12 as illustrated in FIG. 8 and FIG. 9.

In the case where the second insulating portion 230B extends between the second through hole conductor TH12 and the positive terminal plate 211, the core portion 212 and the porous portion 214 may be exposed at the end surface of the positive terminal plate 211 in contact with the second insulating portion 230B as illustrated in FIG. 8. In this case, the contact area between the second insulating portion 230B and the porous portion 214 increases, thereby increasing the close contact level and reducing troubles such as peeling.

In the case where the core portion 212 and the porous portion 214 are exposed at the end surface of the positive terminal plate 211 in contact with the second insulating portion 230B, the insulating material may be present in the hollow part of the porous portion 214. That is, the fourth insulating portion 230D may be provided around the second through hole conductor TH12 as illustrated in FIG. 8 and FIG. 9. By filling the porous portion 214 at a predetermined part around the second through hole conductor TH12 with the insulating material, the insulation between the second through hole conductor TH12 and the core portion 212 of the positive terminal plate 211 can be secured and the short circuit can be prevented.

From the viewpoint of increasing the advantages described above, the thickness of the fourth insulating portion 230D may be larger than the thickness of the porous portion 214 as illustrated in FIG. 8.

In the case where the core portion 212 and the porous portion 214 are exposed at the end surface of the positive terminal plate 211 in contact with the second insulating portion 230B, the insulating material may not be present in the hollow part of the porous portion 214. In this case, the hollow part of the porous portion 214 is exposed at the end surface of the positive terminal plate 211.

In the case where the second insulating portion 230B extends between the second through hole conductor TH12 and the positive terminal plate 211, the insulating material for the second insulating portion 230B may be present in the hollow part of the porous portion 214. Thus, the mechanical strength of the porous portion 214 can be improved. Further, the occurrence of delamination that may be caused by the gap in the porous portion 214 can be reduced.

The insulating material for the second insulating portion 230B may have a larger thermal expansion coefficient than the material for the second through hole conductor TH12 (for example, copper). In this case, the insulating material for the second insulating portion 230B is expanded under a high-temperature environment to push the porous portion 214 and the second through hole conductor TH12. Thus, the occurrence of delamination can further be reduced.

The thermal expansion coefficient of the insulating material for the second insulating portion 230B may be equal to the thermal expansion coefficient of the material for the second through hole conductor TH12, or may be smaller than the thermal expansion coefficient of the material for the second through hole conductor TH12.

The second through hole h12 may be filled with a material containing a resin. That is, as illustrated in FIG. 8 and FIG. 9, a second resin-filling portion 242B may be provided in the second through hole h12. A gap is eliminated by filling the second through hole h12 with the resin material. Thus, it is possible to reduce the occurrence of delamination of the second through hole conductor TH12 formed on the inner wall surface of the second through hole h12.

The material that fills the second through hole h12 may have a larger thermal expansion coefficient than the material for the second through hole conductor TH12 (for example, copper). In this case, the material that fills the second through hole h12 is expanded under a high-temperature environment to push the second through hole conductor TH12 from the inner side portion to the outer side portion of the second through hole h12. Thus, the occurrence of delamination of the second through hole conductor TH12 can further be reduced.

The thermal expansion coefficient of the material that fills the second through hole h12 may be equal to the thermal expansion coefficient of the material for the second through hole conductor TH12, or may be smaller than the thermal expansion coefficient of the material for the second through hole conductor TH12.

The semiconductor composite device according to aspects of the present disclosure may include a third through hole conductor that is not connected to the positive terminal or the negative terminal of the capacitor such as the output capacitor. For example, a line connected to the ground is similarly connected to the top and the bottom of the wiring board via the through hole conductor in addition to the first through hole conductor connected to the positive terminal of the capacitor and the second through hole conductor connected to the negative terminal of the capacitor. Thus, the degree of freedom in terms of design of the semiconductor composite device can be improved and the semiconductor composite device can further be downsized.

As described above, the through hole conductors are classified into A. the through hole conductor for a positive terminal of a capacitor, B. the through hole conductor for a negative terminal of a capacitor and for a ground, and C. the through hole conductor for an I/O line. The first through hole conductor corresponds to A. the through hole conductor for a positive terminal of a capacitor. The second through hole conductor corresponds to B. the through hole conductor for a negative terminal of a capacitor and for a ground. The third through hole conductor corresponds to C. the through hole conductor for an I/O line.

Among A. the through hole conductors for a positive terminal of a capacitor, a through hole conductor directly connected to the end surface of the positive terminal plate can be formed, for example, by the following method.
    1. A through hole 1 is formed by drilling, laser machining, or the like at a part where the through hole conductor is to be formed.
    2. The through hole conductor is formed by metalizing the inner wall surface of the through hole 1 by plating or the like.
    B. The through hole conductor for a negative terminal of a capacitor and for a ground and C. the through hole conductor for an I/O line can be formed, for example, by the following method.
    1. A through hole 1 is formed by drilling, laser machining, or the like at a part where the through hole conductor is to be formed.
    2. The through hole 1 is filled with a resin.
    3. A through hole 2 is formed by drilling, laser machining, or the like in the resin that fills the through hole 1. At this time, the resin is left between the through hole 1 and the through hole 2 by setting the diameter of the through hole 2 to be smaller than the diameter of the resin.

4. The through hole conductor is formed by metalizing the inner wall surface of the through hole 2 by plating or the like.

Aspects of the present disclosure different than those described above are that the inductors are electrically connected to the through hole conductors extending through the capacitor array and the inductors are positioned to overlap the capacitor array. In accordance with aspects of the present disclosure, the disposition of the switching elements may be identical to or different from those described above.

Figure 10:
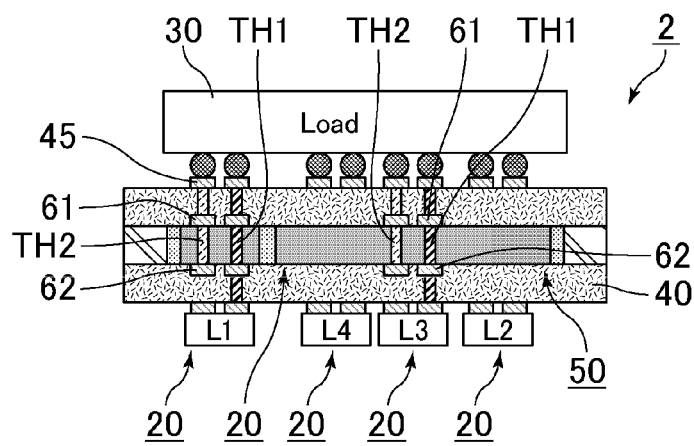
FIG. 10 is a cross-sectional view schematically illustrating an example of a semiconductor composite device in accordance with aspects of the present disclosure.
Figure 11:
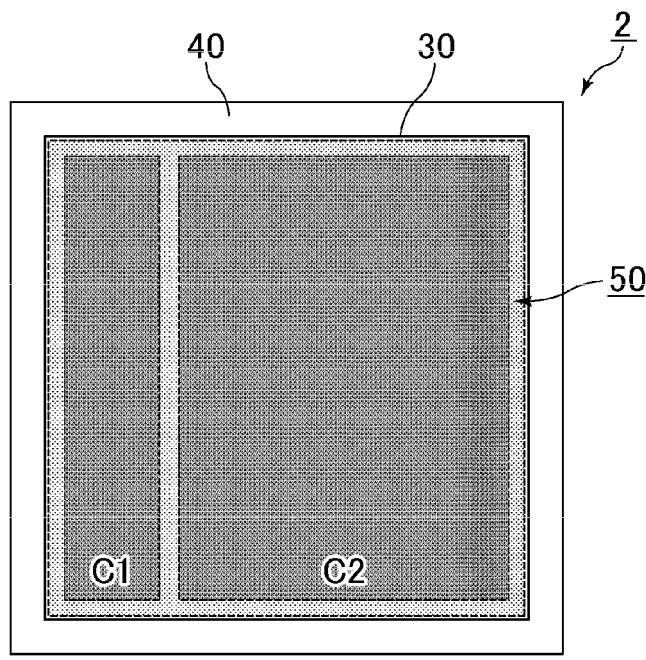
FIG. 11 is a plan view of the semiconductor composite device illustrated in FIG. 10 that is viewed from one mounting surface of a wiring board.
Figure 12:
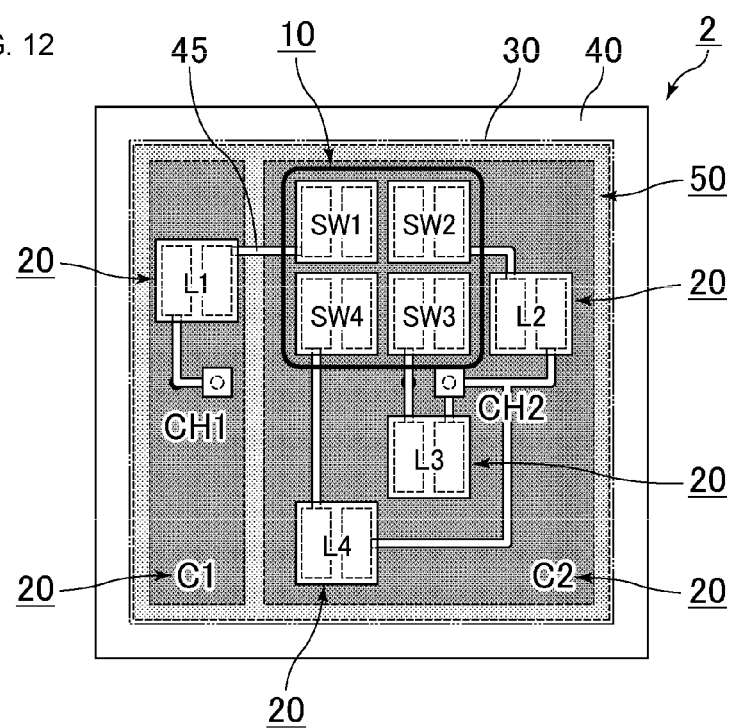
FIG. 12 is a plan view of the semiconductor composite device illustrated in FIG. 10 that is viewed from the other mounting surface of the wiring board.

FIG. 10 is a cross-sectional view schematically illustrating an example of a semiconductor composite device in accordance with aspects of the present disclosure. FIG. 11 is a plan view of the semiconductor composite device illustrated in FIG. 10 that is viewed from one mounting surface of a wiring board. FIG. 12 is a plan view of the semiconductor composite device illustrated in FIG. 10 that is viewed from the other mounting surface of the wiring board. FIG. 10 illustrates an example of two channels, but the number of channels may be three or more.

A semiconductor composite device 2 illustrated in FIG. 10, FIG. 11, and FIG. 12 includes, similarly to the semiconductor composite device 1 illustrated in FIG. 2 and FIG. 3, the active elements 10 and the passive elements 20 constituting the voltage regulator, the load 30 to be supplied with the direct-current voltage regulated by the voltage regulator, and the wiring board 40 electrically connected to the active elements 10, the passive elements 20, and the load 30.

In the semiconductor composite device 2 illustrated in FIG. 10, FIG. 11, and FIG. 12, the inductor L1 disposed in the first channel CH1 and the inductors L2, L3, and L4 disposed in the second channel CH2 are electrically connected to the through hole conductors TH1 extending through the capacitor array 50.

The inductors L1, L2, L3, and L4 electrically connected to the through hole conductors TH1 are disposed opposite the load 30 when viewed from the capacitor array 50, and at least parts of the inductors L1, L2, L3, and L4 are positioned to overlap the capacitor array 50 when viewed from the mounting surface of the wiring board 40. In the example illustrated in FIG. 10, FIG. 11, and FIG. 12, the inductors L1, L2, L3, and L4 are disposed on the other mounting surface of the wiring board 40.

The semiconductor composite device in accordance with aspects of the present disclosure has a feature in that the inductor disposed in at least one channel is electrically connected to the through hole conductor extending through the capacitor array and at least a part of the inductor electrically connected to the through hole conductor is positioned to overlap the capacitor array when viewed from the mounting surface of the wiring board. The inductor may be disposed opposite the load when viewed from the capacitor array, but may be disposed between the capacitor array and the load.

In accordance with aspects of the present disclosure, the inductor is not disposed in the same plane as that of the capacitor because the semiconductor composite device has the feature described above. Thus, the connection distance from the inductor to the capacitor can be shortened. As a result, the loss due to the wiring can be reduced.

In the semiconductor composite in accordance with aspects of the present disclosure, the inductors disposed in all the channels may be electrically connected to the through hole conductors extending through the capacitor array.

In the semiconductor composite device in accordance with aspects of the present disclosure, the through hole conductor connected to the inductor may be connected to the positive terminal of the capacitor such as the output capacitor. In this case, the through hole conductor connected to the positive terminal of the capacitor may be connected to the end surface of the positive terminal plate described above.

Aspects of the present disclosure different from aspects described above include through hole conductors connected to the inductors disposed in the respective power supply circuits constituting the multi-phase power supply are connected to the positive terminal of the capacitor such as the output capacitor and the plurality of through hole conductors connected to the respective inductors are electrically connected via the positive terminal of the capacitor.

Figure 13:
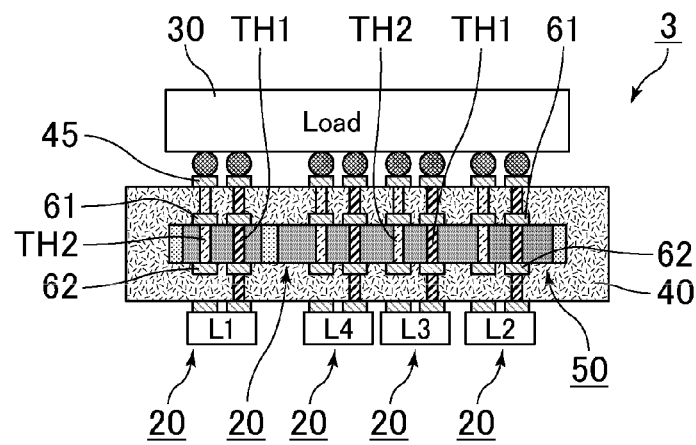
FIG. 13 is a cross-sectional view schematically illustrating an example of a semiconductor composite device in accordance with aspects of the present disclosure.
Figure 14:
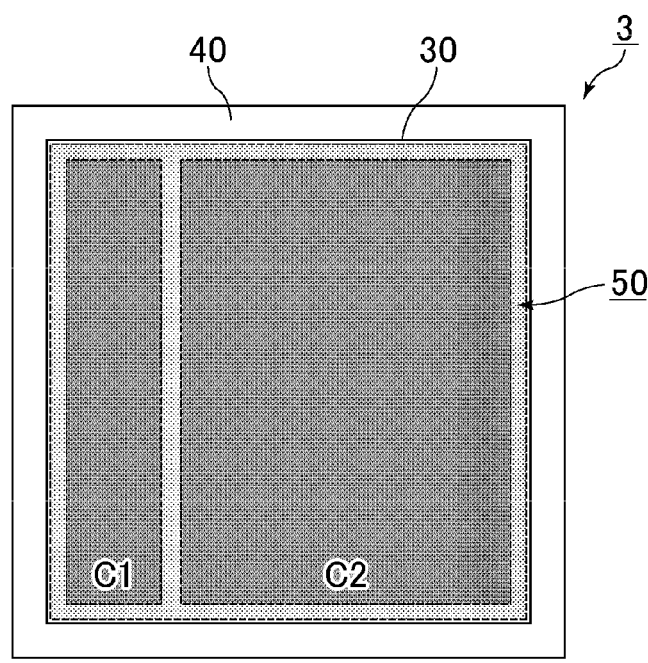
FIG. 14 is a plan view of the semiconductor composite device illustrated in FIG. 13 that is viewed from one mounting surface of a wiring board.
Figure 15:
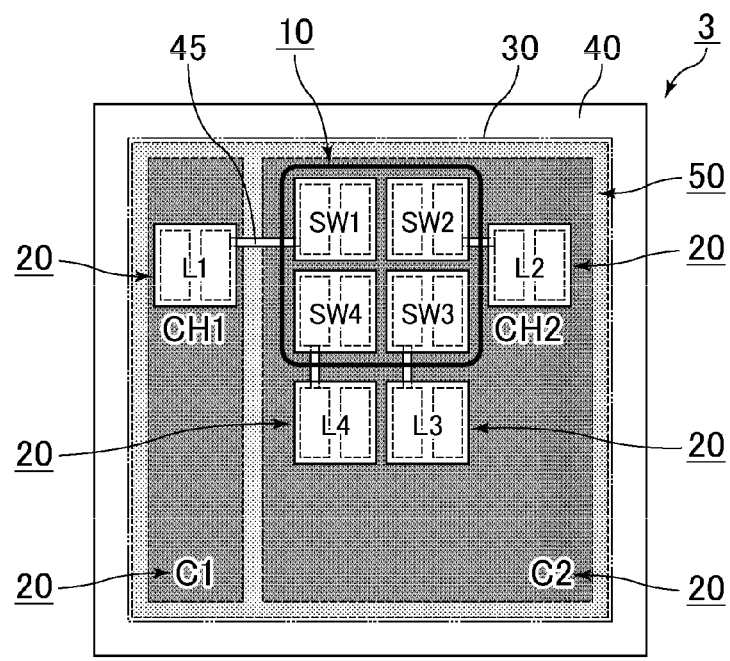
FIG. 15 is a plan view of the semiconductor composite device illustrated in FIG. 13 that is viewed from the other mounting surface of the wiring board.

FIG. 13 is a cross-sectional view schematically illustrating an example of a semiconductor composite device in accordance with aspects of the present disclosure. FIG. 14 is a plan view of the semiconductor composite device illustrated in FIG. 13 that is viewed from one mounting surface of a wiring board. FIG. 15 is a plan view of the semiconductor composite device illustrated in FIG. 13 that is viewed from the other mounting surface of the wiring board. FIG. 13 illustrates an example of two channels, but the number of channels may be three or more.

A semiconductor composite device 3 illustrated in FIG. 13, FIG. 14, and FIG. 15 includes, similarly to the semiconductor composite device 1 illustrated in FIG. 2 and FIG. 3, the active elements 10 and the passive elements 20 constituting the voltage regulator, the load 30 to be supplied with the direct-current voltage regulated by the voltage regulator, and the wiring board 40 electrically connected to the active elements 10, the passive elements 20, and the load 30.

In the semiconductor composite device 3 illustrated in FIG. 13, FIG. 14, and FIG. 15, the inductor L1 disposed in the first channel CH1 and the inductors L2, L3, and L4 disposed in the second channel CH2 are electrically connected to the through hole conductors TH1 extending through the capacitor array 50.

The inductors L1, L2, L3, and L4 electrically connected to the through hole conductors TH1 are disposed opposite the load 30 when viewed from the capacitor array 50, and at least parts of the inductors L1, L2, L3, and L4 are positioned to overlap the capacitor array 50 when viewed from the mounting surface of the wiring board 40. In the example illustrated in FIG. 13, FIG. 14, and FIG. 15, the inductors L1, L2, L3, and L4 are disposed on the other mounting surface of the wiring board 40.

In the second channel CH2 constituting the multi-phase power supply, the through hole conductor TH1 connected to the inductor L2 disposed in the power supply circuit, the through hole conductor TH2 connected to the inductor L3 disposed in the power supply circuit, and the through hole conductor TH1 connected to the inductor L4 disposed in the power supply circuit are connected to a positive terminal of the output capacitor C2. Further, the plurality of through hole conductors TH1 connected to the respective inductors L2, L3, and L4 are electrically connected via the positive terminal of the output capacitor C2.

The semiconductor composite device in accordance with aspects of the present disclosure has a feature in that, in the channels constituting the multi-phase power supply, the through hole conductors connected to the inductors disposed in the respective power supply circuits are connected to the positive terminal of the capacitor such as the output capacitor and the plurality of through hole conductors connected to the respective inductors are electrically connected via the positive terminal of the capacitor.

If the connection distances from the individual switching elements to the load are different in the channels constituting the multi-phase power supply, the inductance from the wiring changes and therefore the phase designing becomes difficult. In accordance with aspects of the present disclosure, the plurality of inductors are not connected by routing the wiring but are connected via the positive terminal of the capacitor. Thus, the routing of the wiring can be minimized. As a result, the wiring loss can further be reduced and the phase shift can be prevented.

In the semiconductor composite device in accordance with aspects of the present disclosure, the through hole conductor connected to the positive terminal of the capacitor such as the output capacitor may be connected to the end surface of the positive terminal plate described above in accordance with aspects of the present disclosure.

In accordance with aspects of the present disclosure, the inductor electrically connected to the through hole conductor may be disposed opposite the load when viewed from the capacitor array, but may be disposed between the capacitor array and the load.

Figure 16:
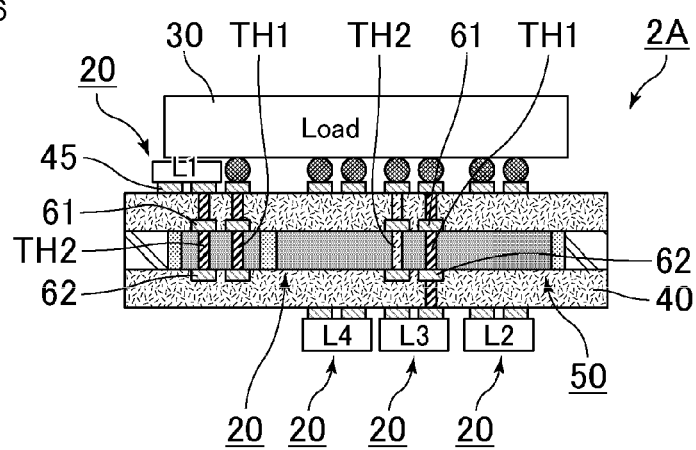
FIG. 16 is a cross-sectional view schematically illustrating another example of the semiconductor composite device in accordance with aspects of the present disclosure.

FIG. 16 is a cross-sectional view schematically illustrating another example of the semiconductor composite device in accordance with aspects of the present disclosure.

In a semiconductor composite device 2A illustrated in FIG. 16, the inductor L1 is disposed on the one mounting surface of the wiring board 40 between the capacitor array 50 and the load 30. The inductors L2, L3, and L4 are disposed on the other mounting surface of the wiring board 40 opposite the load 30 when viewed from the capacitor array 50.

The inductor L1 may be disposed on the other mounting surface of the wiring board 40 opposite the load 30 when viewed from the capacitor array 50, and the inductors L2, L3, and L4 may be disposed on the one mounting surface of the wiring board 40 between the capacitor array 50 and the load 30. Alternatively, the inductors L1, L2, L3, and L4 may be disposed on the one mounting surface of the wiring board 40 between the capacitor array 50 and the load 30.

In accordance with aspects of the present disclosure, in the case where the inductor electrically connected to the through hole conductor is disposed opposite the load when viewed from the capacitor array, the inductor may be disposed on the mounting surface of the wiring board or embedded in the wiring board.

FIG. 17 is a cross-sectional view schematically illustrating still another example of the semiconductor composite device in accordance with aspects of the present disclosure.

In a semiconductor composite device 2B illustrated in FIG. 17, the inductors L1, L2, L3, and L4 are disposed opposite the load 30 when viewed from the capacitor array 50. The inductors L1 and L2 are embedded in the wiring board 40. The inductors L2 and L4 are disposed on the other mounting surface of the wiring board 40.

In accordance with aspects of the present disclosure, in the channel in which the inductor is electrically connected to the through hole conductor, at least a part of the switching element may be positioned to overlap the capacitor array when viewed from the mounting surface of the wiring board. In this case, the connection distance from the switching element to the load can further be shortened. The switching element may be disposed opposite the load when viewed from the capacitor array, but may be disposed between the capacitor array and the load.

A method for manufacturing a semiconductor composite device including a capacitor array embedded in a wiring board is described below as an example of the method for manufacturing the semiconductor composite device in accordance with aspects of the present disclosure. Such a method for manufacturing the semiconductor composite device is also one element of the present disclosure.

The method for manufacturing the semiconductor composite device in accordance with aspects of the present disclosure includes a step of forming a cavity in a wiring board, a step of disposing a capacitor array in the cavity, a step of electrically connecting the wiring board and the capacitor array, and a step of embedding the capacitor array into the wiring board by sealing the cavity.

In the method for manufacturing the semiconductor composite device in accordance with aspects of the present disclosure, the order of the steps described above is not particularly limited.

In the method for manufacturing the semiconductor composite device in accordance with aspects of the present disclosure, the method for electrically connecting the capacitor array disposed in the cavity to the wiring board is not particularly limited. Examples of the method include via connection, bump connection, plating connection, and connection via conductive paste of an anisotropic conductive film or the like.

Regarding the depth of the cavity formed in the wiring board in the method for manufacturing the semiconductor composite device in accordance with aspects of the present disclosure, the cavity may be formed through the wiring board, or may be formed so as not to extend through the wiring board.

An example in which the cavity is formed through the wiring board is described as a first method for manufacturing the semiconductor composite device in accordance with aspects of the present disclosure.

FIG. 18A and FIG. 18B are cross-sectional views schematically illustrating an example of the step of forming the cavity in the wiring board.

As illustrated in FIG. 18A, a wiring board 400 including wiring layers 420 on both surfaces of a core layer 410 is prepared. Then, a cavity 430 is formed through the wiring board 400 as illustrated in FIG. 18B.

FIG. 19 is a cross-sectional view schematically illustrating an example of a step of applying a tape to the wiring board.

As illustrated in FIG. 19, a tape 440 is applied to one surface of the wiring board 400.

Figure 20:
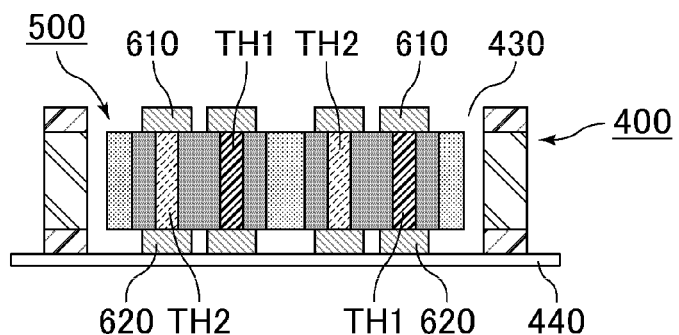
FIG. 20 is a cross-sectional view schematically illustrating an example of a step of disposing a capacitor array in the cavity.

FIG. 20 is a cross-sectional view schematically illustrating an example of the step of disposing the capacitor array in the cavity.

As illustrated in FIG. 20, a capacitor array 500 is disposed in the cavity 430 by fixing the capacitor array 500 onto the tape 440.

The capacitor array 500 includes the plurality of through hole conductors TH1 and TH2 extending through the capacitor array 500 in a direction perpendicular to the mounting surface of the wiring board 400. A first connection terminal 610 is formed at one end portion of the through hole conductor TH1 or TH2. A second connection terminal 620 is formed at the other end portion of the through hole conductor TH1 or TH2. In the example illustrated in FIG. 20, a part of the capacitor array 500 on the second connection terminal 620 side is fixed onto the tape 440.

Figure 21:
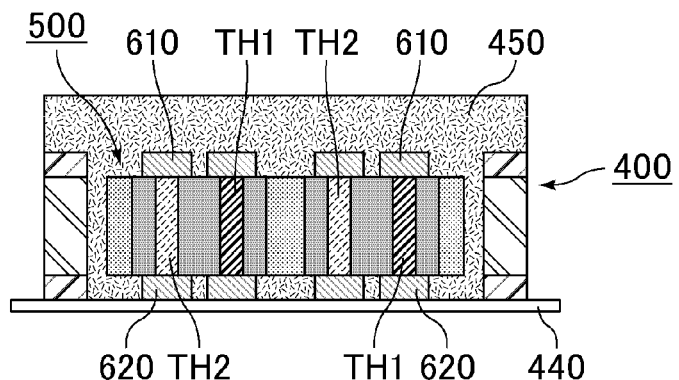
FIG. 21 is a cross-sectional view schematically illustrating an example of a step of performing resin sealing from one connection terminal side of the capacitor array.

FIG. 21 is a cross-sectional view schematically illustrating an example of a step of performing resin sealing from one connection terminal side of the capacitor array.

As illustrated in FIG. 21, an insulating layer 450 is formed by performing the resin sealing from the one connection terminal side of the capacitor array 500 by using an insulating laminate material. In the example illustrated in FIG. 21, the resin sealing is performed from the first connection terminal 610 side where the tape 440 is not applied.

Figure 22:
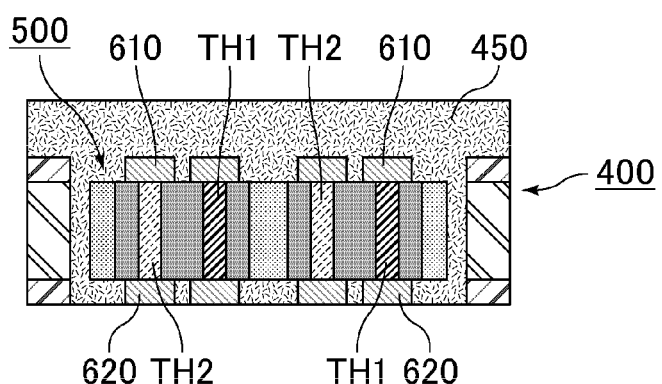
FIG. 22 is a cross-sectional view schematically illustrating an example of a step of peeling the tape from the wiring board.

FIG. 22 is a cross-sectional view schematically illustrating an example of a step of peeling the tape from the wiring board.

As illustrated in FIG. 22, the tape 440 is peeled from the wiring board 400.

Figure 23:
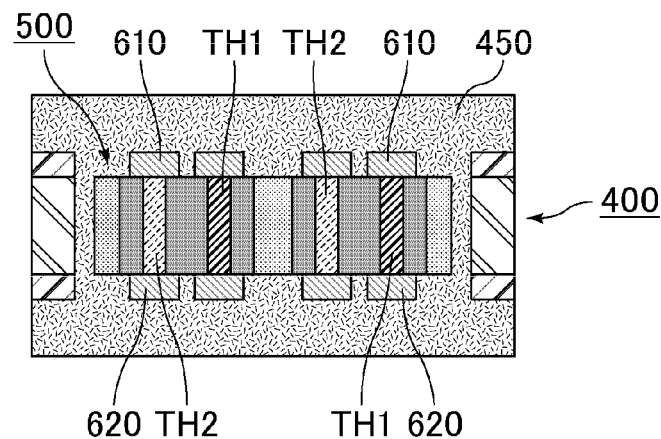
FIG. 23 is a cross-sectional view schematically illustrating an example of a step of performing resin sealing from the other connection terminal side of the capacitor array.

FIG. 23 is a cross-sectional view schematically illustrating an example of a step of performing resin sealing from the other connection terminal side of the capacitor array.

As illustrated in FIG. 23, the insulating layer 450 is formed by performing the resin sealing from the other connection terminal side of the capacitor array 500 by using the insulating laminate material. In the example illustrated in FIG. 23, the resin sealing is performed from the second connection terminal 620 side where the tape 440 has been peeled off. Thus, the capacitor array 500 is embedded in the wiring board 400.

Figure 24:
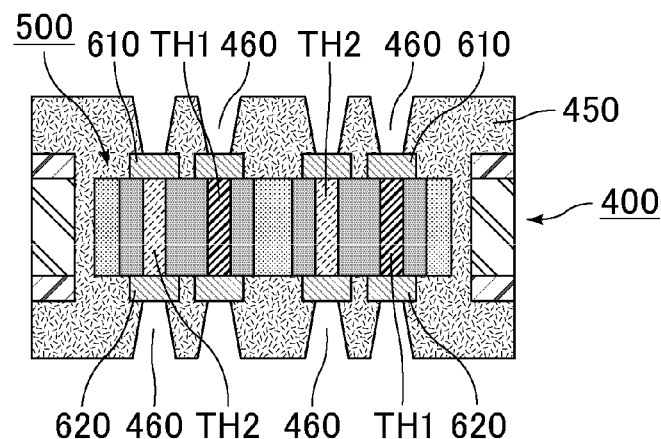
FIG. 24 is a cross-sectional view schematically illustrating an example of a step of forming via holes.

FIG. 24 is a cross-sectional view schematically illustrating an example of a step of forming via holes.

As illustrated in FIG. 24, via holes 460 are formed in the insulating layer 450 to expose the first connection terminals 610 and the second connection terminals 620.

Figure 25:
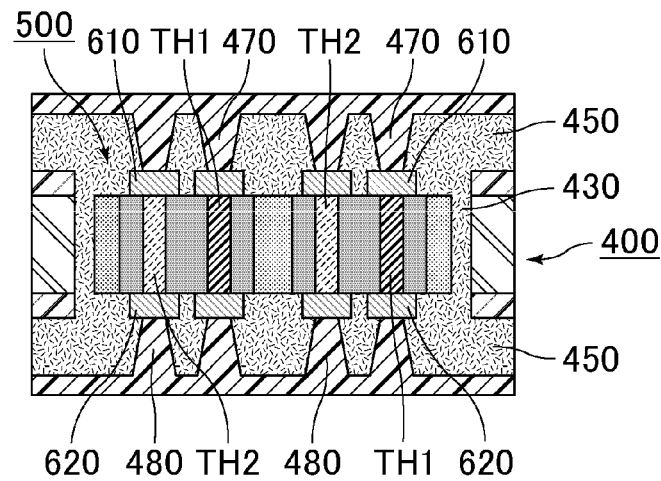
FIG. 25 is a cross-sectional view schematically illustrating an example of a step of performing plating.

FIG. 25 is a cross-sectional view schematically illustrating an example of a step of performing plating.

As illustrated in FIG. 25, first conductor portions 470 and second conductor portions 480 are formed in the via holes 460 by plating. The first conductor portion 470 and the second conductor portion 480 are also formed on the surfaces of the insulating layers 450. The first conductor portions 470 are connected to the first connection terminals 610. The second conductor portions 480 are connected to the second connection terminals 620. Thus, the wiring board 400 and the capacitor array 500 are electrically connected.

Then, components such as active elements including switching elements and a load including a semiconductor element are disposed. At this time, at least a part of the capacitor array is disposed to overlap the load when viewed from the mounting surface of the wiring board. In the manner described above, the semiconductor composite device is obtained.

An example in which the cavity is formed so as not to extend through the wiring board is described as a second method for manufacturing the semiconductor composite device in accordance with aspects of the present disclosure.

Figure 26A:
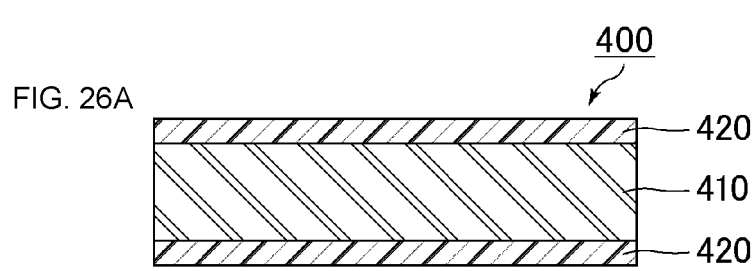
FIG. 26A and FIG. 26B are cross-sectional views schematically illustrating an example of a step of forming a cavity in a wiring board.
Figure 26B:
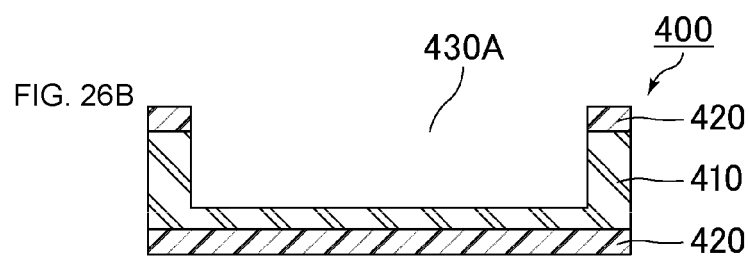

FIG. 26A and FIG. 26B are cross-sectional views schematically illustrating an example of the step of forming the cavity in the wiring board.

As illustrated in FIG. 26A, the wiring board 400 including the wiring layers 420 on both surfaces of the core layer 410 is prepared. Then, a cavity 430A is formed so as not to extend through the wiring board 400 as illustrated in FIG. 26B.

Figure 27:
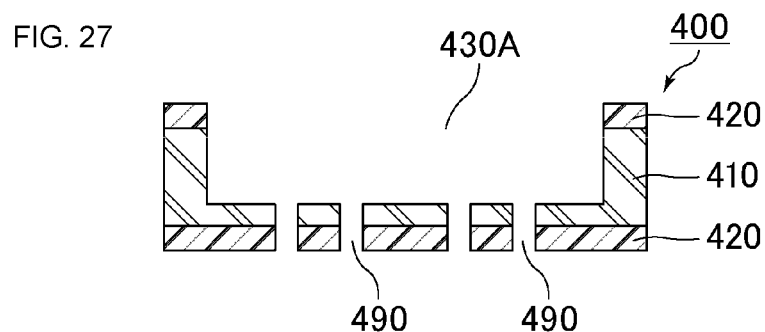
FIG. 27 is a cross-sectional view schematically illustrating an example of a step of forming through holes.

FIG. 27 is a cross-sectional view schematically illustrating an example of a step of forming through holes.

As illustrated in FIG. 27, through holes 490 are formed in the core layer 410 and the wiring layer 420 where the cavity 430A is not formed. In the example illustrated in FIG. 27, the through holes 490 are formed at parts where the second conductor portions 480 (see FIG. 28) connected to the second connection terminals 620 (see FIG. 29) of the capacitor array 500 are to be formed.

Figure 28:
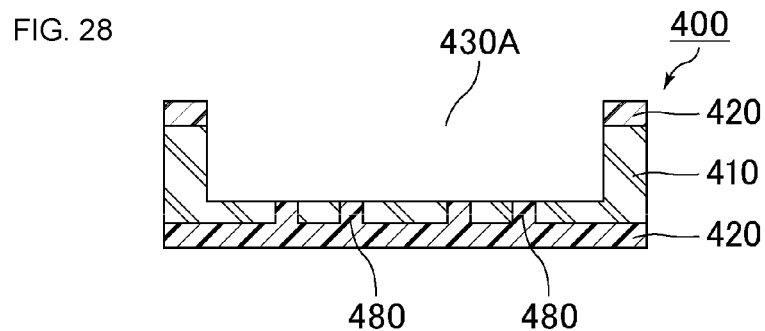
FIG. 28 is a cross-sectional view schematically illustrating an example of a step of performing patterning and plating.

FIG. 28 is a cross-sectional view schematically illustrating an example of a step of performing patterning and plating.

As illustrated in FIG. 28, the second conductor portions 480 are formed in the through holes 490 by patterning and plating.

Figure 29:
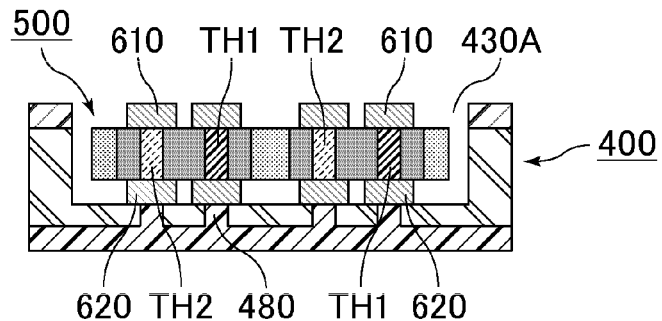
FIG. 29 is a cross-sectional view schematically illustrating an example of a step of disposing a capacitor array in the cavity.

FIG. 29 is a cross-sectional view schematically illustrating an example of the step of disposing the capacitor array in the cavity.

As illustrated in FIG. 29, the capacitor array 500 is disposed in the cavity 430.

The capacitor array 500 includes the plurality of through hole conductors TH1 and TH2 extending through the capacitor array 500 in the direction perpendicular to the mounting surface of the wiring board 400. The first connection terminal 610 is formed at one end portion of the through hole conductor TH1 or TH2. The second connection terminal 620 is formed at the other end portion of the through hole conductor TH1 or TH2. In the example illustrated in FIG. 29, the second connection terminals 620 of the capacitor array 500 are connected to the second conductor portions 480 by reflow joining.

Figure 30:
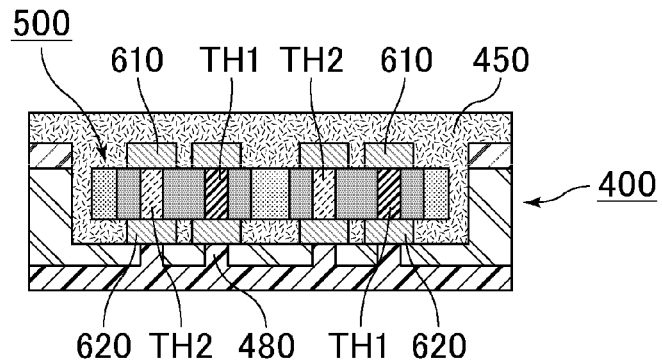
FIG. 30 is a cross-sectional view schematically illustrating an example of a step of performing resin sealing.

FIG. 30 is a cross-sectional view schematically illustrating an example of a step of performing resin sealing.

As illustrated in FIG. 30, the insulating layer 450 is formed by performing the resin sealing from the one connection terminal side of the capacitor array 500 by using the insulating laminate material. In the example illustrated in FIG. 30, the resin sealing is performed from the first connection terminal 610 side.

Figure 31:
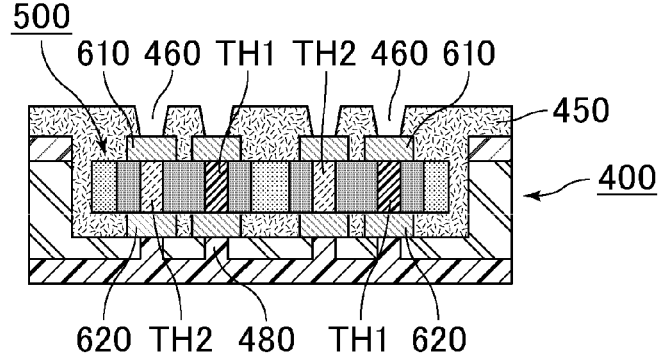
FIG. 31 is a cross-sectional view schematically illustrating an example of a step of forming via holes.

FIG. 31 is a cross-sectional view schematically illustrating an example of a step of forming via holes.

As illustrated in FIG. 31, the via holes 460 are formed in the insulating layer 450 to expose the first connection terminals 610.

Figure 32:
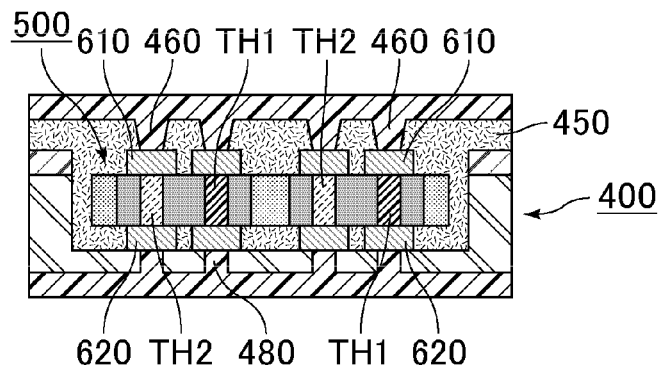
FIG. 32 is a cross-sectional view schematically illustrating an example of a step of performing plating.

FIG. 32 is a cross-sectional view schematically illustrating an example of a step of performing plating.

As illustrated in FIG. 32, the first conductor portions 470 are formed in the via holes 460 by plating. The first conductor portion 470 is also formed on the surface of the insulating layer 450. The first conductor portions 470 are connected to the first connection terminals 610. Thus, the wiring board 400 and the capacitor array 500 are electrically connected.

Then, components such as active elements including switching elements and a load including a semiconductor element are disposed. At this time, at least a part of the capacitor array is disposed to overlap the load when viewed from the mounting surface of the wiring board. In the manner described above, the semiconductor composite device is obtained.

The semiconductor composite device of the present disclosure is not limited to those in the aspects described above. Various applications and modifications may be made on the structure and the manufacturing conditions of the semiconductor composite device within the scope of the present disclosure.

In the semiconductor composite device in accordance with aspects of the present disclosure, the passive elements constituting the voltage regulator include at least the capacitors, and may not include the inductors.

In the semiconductor composite device in accordance with aspects of the present disclosure, the capacitor array may include a plurality of capacitor portions obtained by dividing a single capacitor sheet formed from the aluminum element. In this case, the degree of freedom in terms of the disposition of the capacitor portions is improved, thereby attaining greater advantages in terms of, for example, the downsizing of the semiconductor composite device.

In the semiconductor composite device in accordance with aspects of the present disclosure, the capacitor array may be embedded in the wiring board. When the capacitor array is embedded in the wiring board, the mounting area can be reduced.

In the semiconductor composite device in accordance with aspects of the present disclosure, the capacitor array may be used as an interposer for the load, the inductor, or the switching element. Also in this case, at least a part of the capacitor array is positioned to overlap the load when viewed from the mounting surface of the wiring board.

Figure 33:
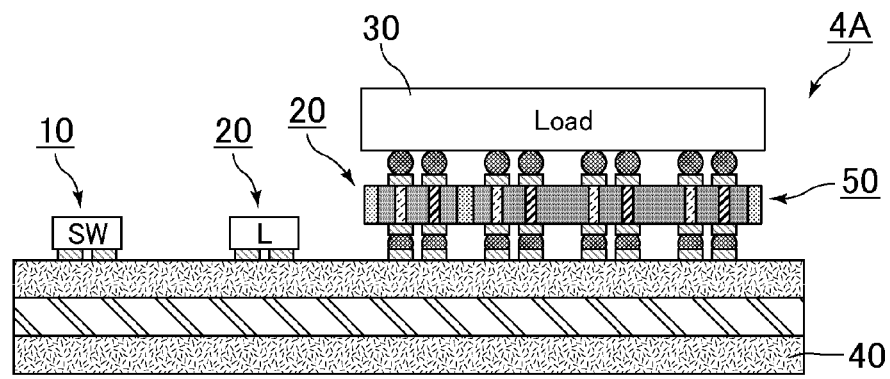
FIG. 33 is a cross-sectional view schematically illustrating a first modified example of the semiconductor composite device of the present disclosure.

FIG. 33 is a cross-sectional view schematically illustrating a first modified example of the semiconductor composite device of the present disclosure.

A semiconductor composite device 4A illustrated in FIG. 33 includes the active elements 10 and the passive elements 20 constituting the voltage regulator, the load 30 to be supplied with the direct-current voltage regulated by the voltage regulator, and the wiring board 40 electrically connected to the active elements 10, the passive elements 20, and the load 30.

The active elements 10 constituting the voltage regulator include a switching element SW. The switching element SW is disposed on the one mounting surface of the wiring board 40.

The passive elements 20 constituting the voltage regulator include the capacitor array 50 and an inductor L. The capacitor array 50 and the inductor L are disposed on the one mounting surface of the wiring board 40.

The load 30 is connected to the capacitor array 50 on the wiring board 40. At least a part of the capacitor array 50 is positioned to overlap the load 30 when viewed from the mounting surface of the wiring board 40.

The semiconductor composite device 4A illustrated in FIG. 33 has a structure similar to that of the semiconductor composite device 1 illustrated in FIG. 2 except that the capacitor array 50 is used as the interposer for the load 30.

Figure 34:
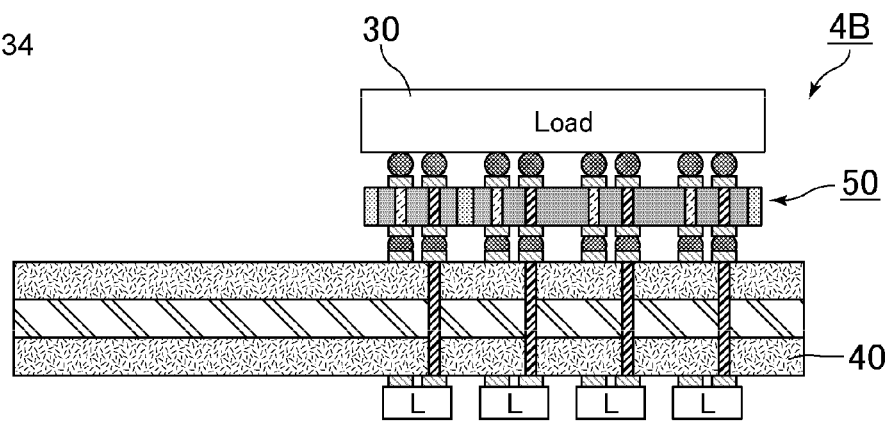
FIG. 34 is a cross-sectional view schematically illustrating a second modified example of the semiconductor composite device of the present disclosure.

FIG. 34 is a cross-sectional view schematically illustrating a second modified example of the semiconductor composite device of the present disclosure.

A semiconductor composite device 4B illustrated in FIG. 34 has a structure similar to that of the semiconductor composite device 3 illustrated in FIG. 13 except that the capacitor array 50 is used as the interposer for the load 30.

Similarly, in the semiconductor composite device 2 illustrated in FIG. 10, the semiconductor composite device 2A illustrated in FIG. 16, and the semiconductor composite device 2B illustrated in FIG. 17, the capacitor array 50 may be used as the interposer for the load 30.

Figure 35:
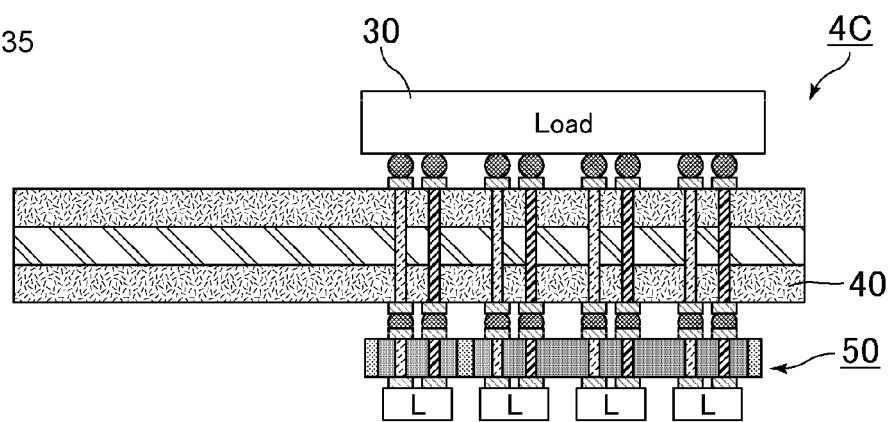
FIG. 35 is a cross-sectional view schematically illustrating a third modified example of the semiconductor composite device of the present disclosure.

FIG. 35 is a cross-sectional view schematically illustrating a third modified example of the semiconductor composite device of the present disclosure.

A semiconductor composite device 4C illustrated in FIG. 35 has a structure similar to that of the semiconductor composite device 3 illustrated in FIG. 13 except that the capacitor array 50 is used as the interposer for the inductors L.

Similarly, in the semiconductor composite device 2 illustrated in FIG. 10, the semiconductor composite device 2A illustrated in FIG. 16, and the semiconductor composite device 2B illustrated in FIG. 17, the capacitor array 50 may be used as the interposer for the inductors L.

The semiconductor composite device in accordance with aspects of the present disclosure may include a plurality of capacitor arrays. For example, in a case where the semiconductor composite device of the present disclosure includes two capacitor arrays, one capacitor array alone may be positioned to overlap the load when viewed from the mounting surface of the wiring board, or both the capacitor arrays may be positioned to overlap the load.

Figure 36:
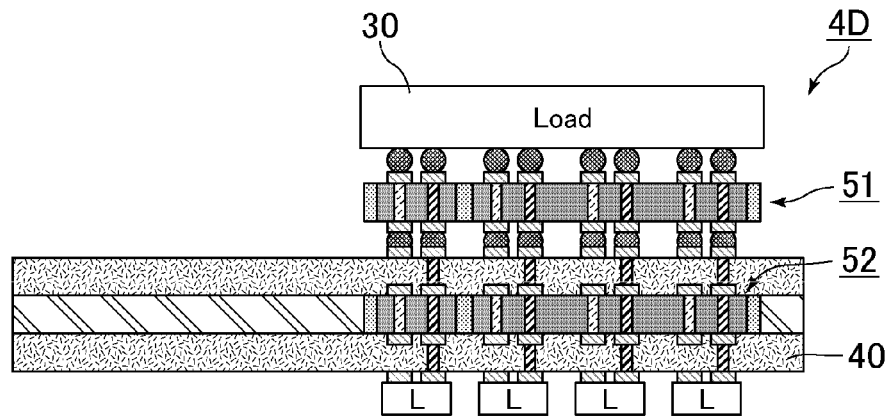
FIG. 36 is a cross-sectional view schematically illustrating a fourth modified example of the semiconductor composite device of the present disclosure.

FIG. 36 is a cross-sectional view schematically illustrating a fourth modified example of the semiconductor composite device of the present disclosure.

A semiconductor composite device 4D illustrated in FIG. 36 includes a first capacitor array 51 and a second capacitor array 52. The first capacitor array 51 is disposed on the one mounting surface of the wiring board 40. The second capacitor array 52 is embedded in the wiring board 40.

The load 30 is connected to the first capacitor array 51 on the wiring board 40. At least a part of the first capacitor array 51 is positioned to overlap the load 30 when viewed from the mounting surface of the wiring board 40. Further, at least a part of the second capacitor array 52 is positioned to overlap the load 30 when viewed from the mounting surface of the wiring board 40.

In the semiconductor composite device 4D illustrated in FIG. 36, for example, both the first capacitor array 51 and the second capacitor array 52 are used as the output capacitors for smoothing the output voltage.

The semiconductor composite device 4D illustrated in FIG. 36 is structured such that the capacitor array is embedded in the wiring board 40 of the semiconductor composite device 4B illustrated in FIG. 34. As another structure, the capacitor array may be embedded in the wiring board 40 of, for example, the semiconductor composite device 4C illustrated in FIG. 35. Alternatively, the structure may be such that the semiconductor composite device 4B illustrated in FIG. 34 is combined with the semiconductor composite device 4C illustrated in FIG. 35, that is, the capacitor array used as the interposer for the load 30 is combined with the capacitor array used as the interposer for the inductors L. The capacitor array may further be embedded in the wiring board 40.

For example, in the case where one capacitor array alone is positioned to overlap the load in the semiconductor composite device including two capacitor arrays, the other capacitor array may be disposed near the switching elements. In this case, the other capacitor array can be used as, for example, an input capacitor for smoothing an input voltage.

Figure 37:
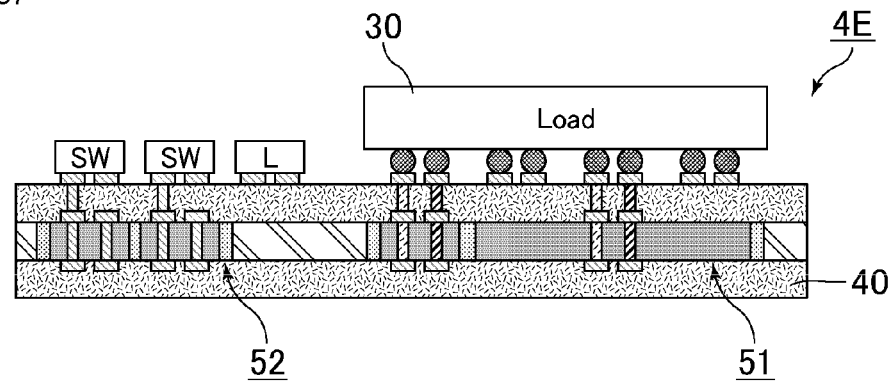
FIG. 37 is a cross-sectional view schematically illustrating a fifth modified example of the semiconductor composite device of the present disclosure.

FIG. 37 is a cross-sectional view schematically illustrating a fifth modified example of the semiconductor composite device of the present disclosure.

Figure 38:
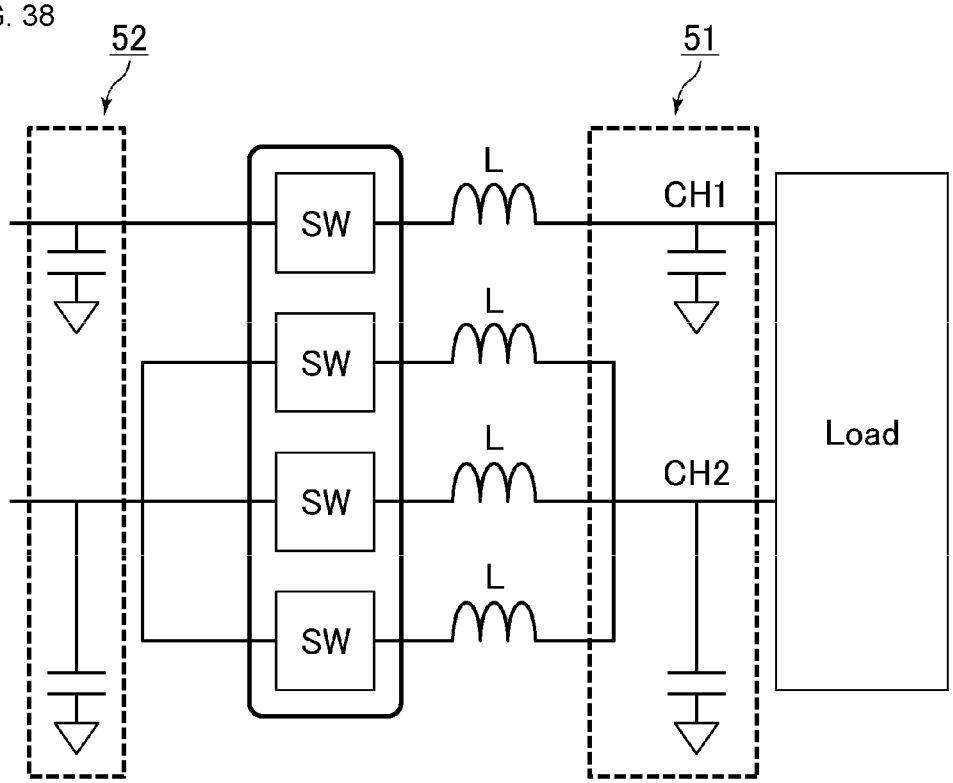
FIG. 38 is a circuit structure diagram of a semiconductor composite device including an input capacitor.

FIG. 38 is a circuit structure diagram of a semiconductor composite device including the input capacitor.

A semiconductor composite device 4E illustrated in FIG. 37 includes the first capacitor array 51 and the second capacitor array 52. Both the first capacitor array 51 and the second capacitor array 52 are embedded in the wiring board 40.

The load 30 is disposed on the one mounting surface of the wiring board 40. At least a part of the first capacitor array 51 is positioned to overlap the load 30 when viewed from the mounting surface of the wiring board 40. The second capacitor array 52 is disposed near the switching elements SW, and is not positioned to overlap the load 30 when viewed from the mounting surface of the wiring board 40.

In the semiconductor composite device 4E illustrated in FIG. 37, the first capacitor array 51 is used as, for example, the output capacitor for smoothing the output voltage, and the second capacitor array 52 is used as, for example, the input capacitor for smoothing the input voltage (see FIG. 38).

The first capacitor array 51 may not be embedded in the wiring board 40. Similarly, the second capacitor array 52 may not be embedded in the wiring board 40.

In the semiconductor composite device in accordance with aspects of the present disclosure, the load may include the semiconductor element and a packaging substrate on which the semiconductor element is mounted.

Figure 39:
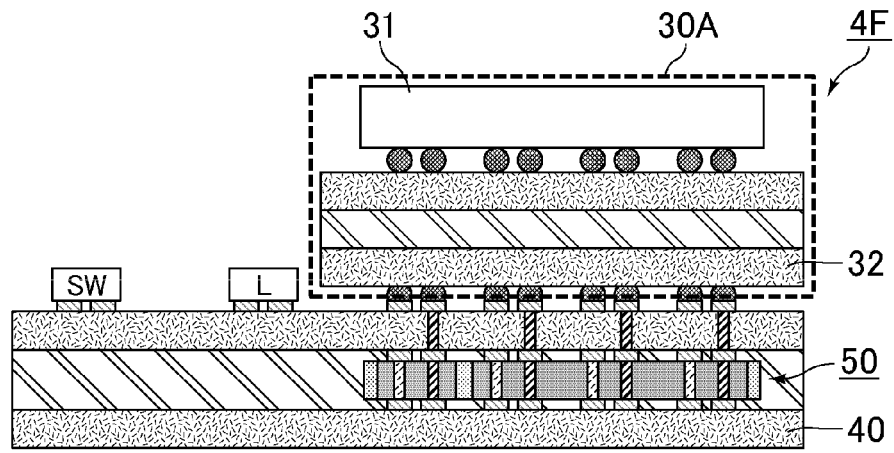
FIG. 39 is a cross-sectional view schematically illustrating a sixth modified example of the semiconductor composite device of the present disclosure.

FIG. 39 is a cross-sectional view schematically illustrating a sixth modified example of the semiconductor composite device of the present disclosure.

In a semiconductor composite device 4F illustrated in FIG. 39, a load 30A includes a semiconductor element 31 and a packaging substrate 32 on which the semiconductor element 31 is mounted. The semiconductor composite device 4F illustrated in FIG. 39 has a structure similar to that of the semiconductor composite device 1 illustrated in FIG. 2 except that the structure of the load is different.

In the semiconductor composite device in accordance with aspects of the present disclosure, the capacitor array may be embedded in the packaging substrate on which the semiconductor element is mounted. The capacitor array embedded in the packaging substrate is positioned to overlap the load. Another capacitor array may be mounted on or embedded in the wiring board. In this case, the other capacitor array may be positioned to overlap the load as the output capacitor, or may be disposed near the switching elements as the input capacitor.

Figure 40:
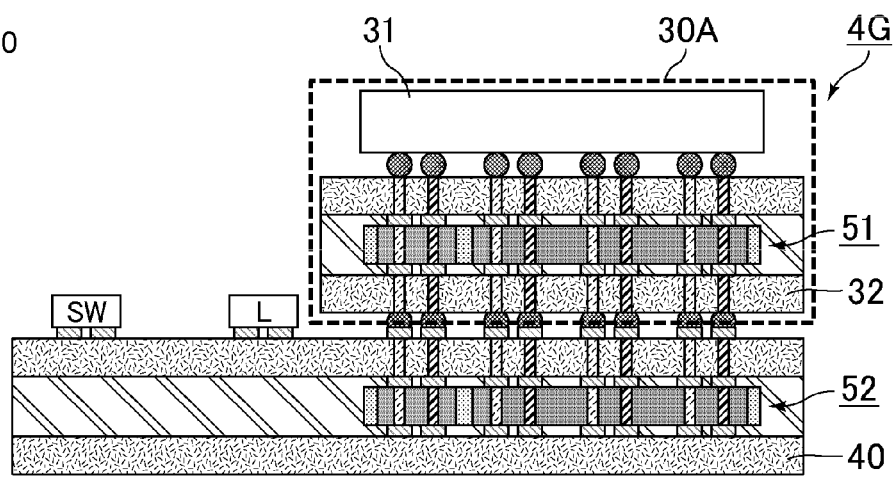
FIG. 40 is a cross-sectional view schematically illustrating a seventh modified example of the semiconductor composite device of the present disclosure.

FIG. 40 is a cross-sectional view schematically illustrating a seventh modified example of the semiconductor composite device of the present disclosure.

A semiconductor composite device 4G illustrated in FIG. 40 includes the first capacitor array 51 and the second capacitor array 52. The load 30A includes the semiconductor element 31 and the packaging substrate 32 on which the semiconductor element 31 is mounted. The first capacitor array 51 is embedded in the packaging substrate 32. The second capacitor array 52 is embedded in the wiring board 40.

At least a part of the first capacitor array 51 is positioned to overlap the load 30A when viewed from the mounting surface of the wiring board 40. Further, at least a part of the second capacitor array 52 is positioned to overlap the load 30A when viewed from the mounting surface of the wiring board 40.

In the semiconductor composite device 4G illustrated in FIG. 40, for example, both the first capacitor array 51 and the second capacitor array 52 are used as the output capacitors for smoothing the output voltage.

Figure 41:
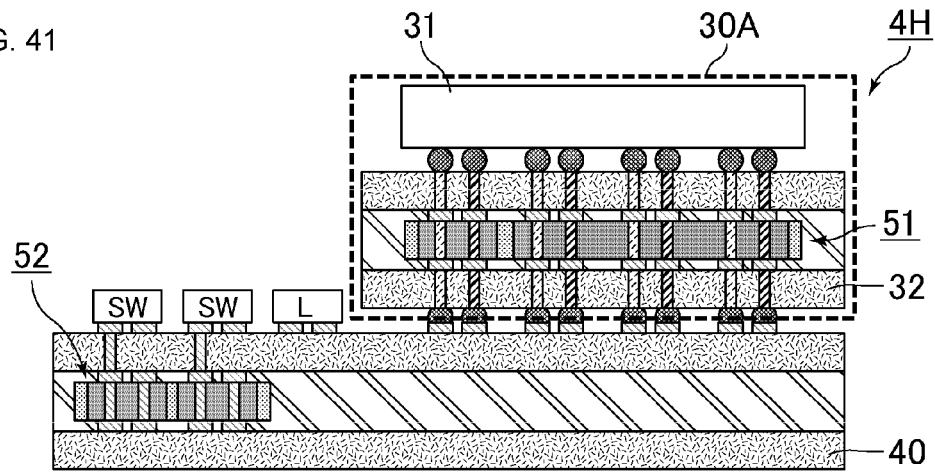
FIG. 41 is a cross-sectional view schematically illustrating an eighth modified example of the semiconductor composite device of the present disclosure.

FIG. 41 is a cross-sectional view schematically illustrating an eighth modified example of the semiconductor composite device of the present disclosure.

A semiconductor composite device 4H illustrated in FIG. 41 is different from the semiconductor composite device 4G illustrated in FIG. 40 in that the second capacitor array 52 is disposed near the switching elements SW.

In the semiconductor composite device 4H illustrated in FIG. 41, the first capacitor array 51 is used as, for example, the output capacitor for smoothing the output voltage, and the second capacitor array 52 is used as, for example, the input capacitor for smoothing the input voltage (see FIG. 38).

The semiconductor composite device in accordance with aspects of the present disclosure may have a power supply circuit including a transformer.

Figure 42:
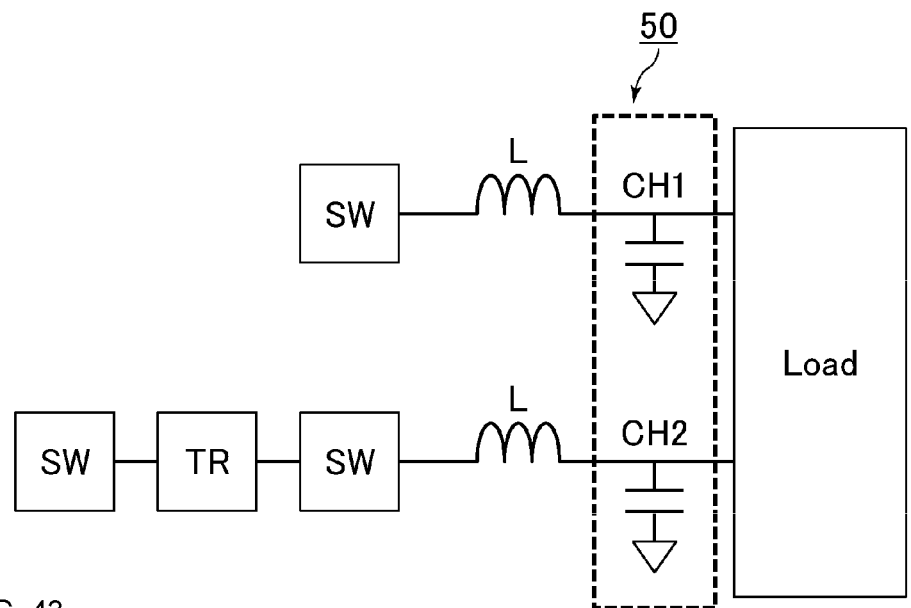
FIG. 42 is an example of a circuit structure diagram of a semiconductor composite device having a power supply circuit including a transformer.

FIG. 42 is an example of a circuit structure diagram of a semiconductor composite device having the power supply circuit including the transformer.

In the example illustrated in FIG. 42, a power supply circuit including a transformer TR is provided in the second channel CH2.

The semiconductor composite device in accordance with aspects of the present disclosure may include a power supply module.

Figure 43:
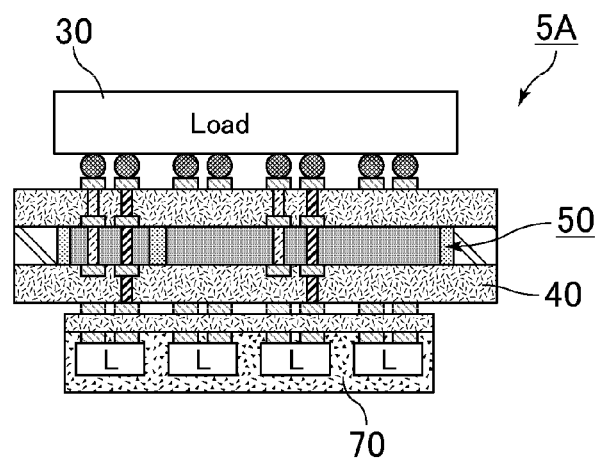
FIG. 43 is a cross-sectional view schematically illustrating an example of a semiconductor composite device including a power supply module.
Figure 44:
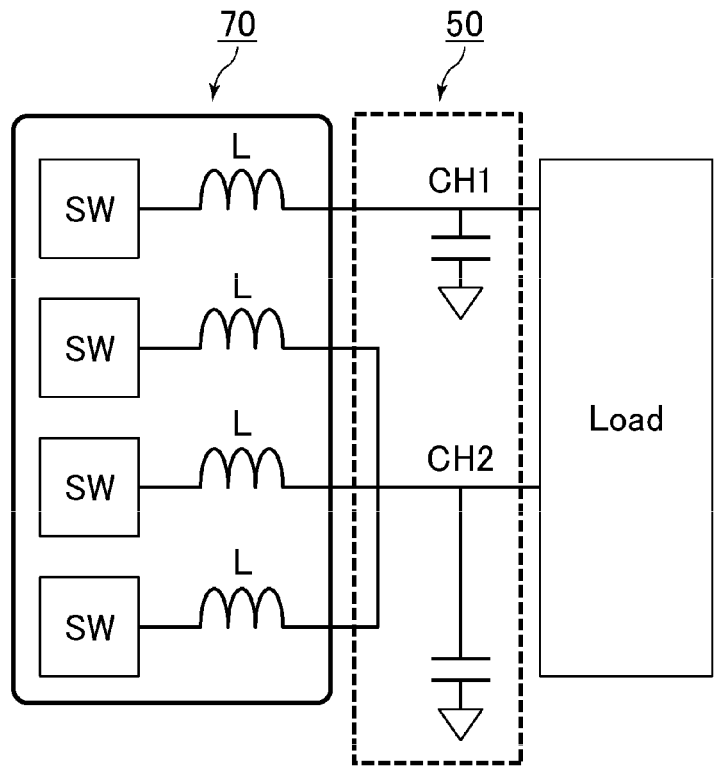
FIG. 44 is an example of a circuit structure diagram of the semiconductor composite device including the power supply module.

FIG. 43 is a cross-sectional view schematically illustrating an example of a semiconductor composite device including the power supply module. FIG. 44 is an example of a circuit structure diagram of the semiconductor composite device including the power supply module.

A semiconductor composite device 5A illustrated in FIG. 43 includes a power supply module 70 including active elements (not illustrated). In the semiconductor composite device 5A illustrated in FIG. 43, the load 30 is disposed on the one mounting surface of the wiring board 40, the capacitor array 50 is embedded in the wiring board 40, and the power supply module 70 is disposed on the other mounting surface of the wiring board 40. As illustrated in FIG. 43, at least a part of the power supply module 70 may be positioned to overlap the load 30 and the capacitor array 50 when viewed from the mounting surface of the wiring board 40.

As illustrated in FIG. 43 and FIG. 44, the inductors L may be mounted in the power supply module 70. As illustrated in FIG. 44, the power supply module 70 may include the switching elements SW.

Figure 45:
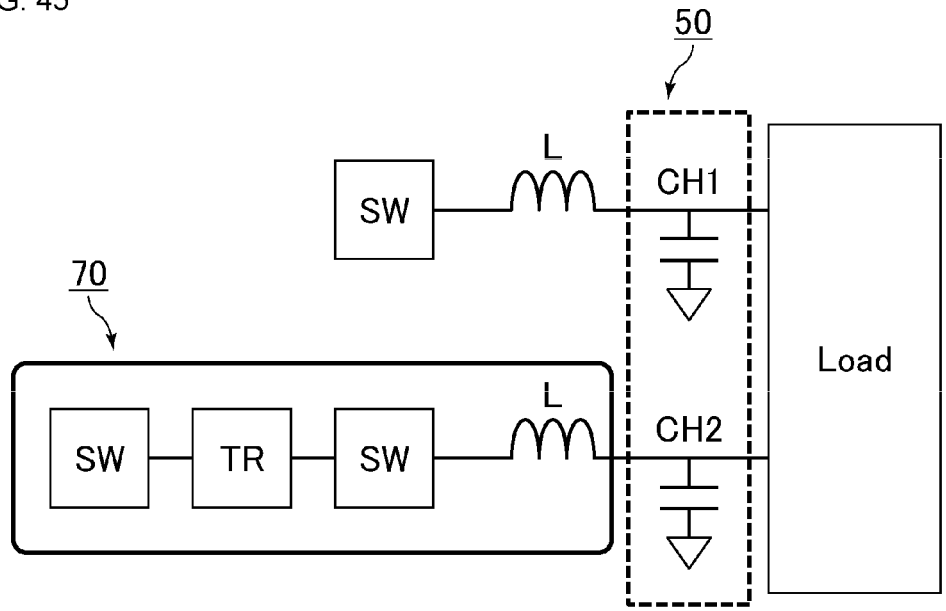
FIG. 45 is another example of the circuit structure diagram of the semiconductor composite device including the power supply module.

FIG. 45 is another example of the circuit structure diagram of the semiconductor composite device including the power supply module.

As illustrated in FIG. 45, the power supply module 70 may include the transformer TR. The power supply module 70 may not include the inductor L, and may not even include the switching element SW on a stage preceding the transformer TR (left side in FIG. 45). The power supply module 70 may include the switching element SW or the inductor L in the first channel CH1.

Figure 46:
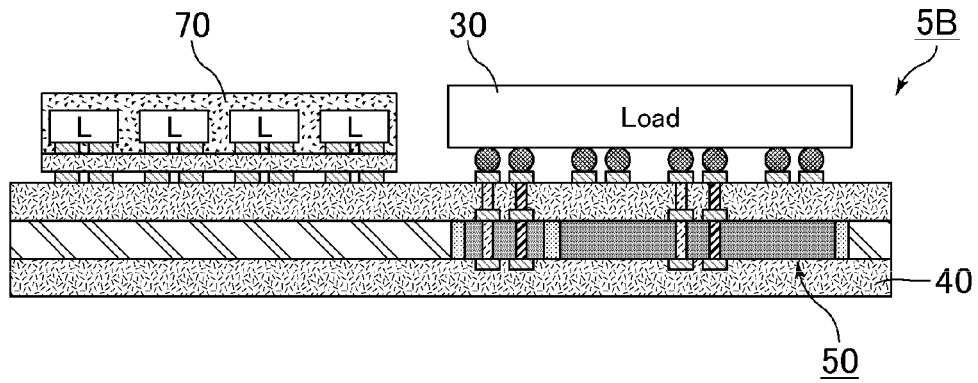
FIG. 46 is a cross-sectional view schematically illustrating another example of the semiconductor composite device including the power supply module.

FIG. 46 is a cross-sectional view schematically illustrating another example of the semiconductor composite device including the power supply module.

In a semiconductor composite device 5B illustrated in FIG. 46, the power supply module 70 is disposed on the one mounting surface of the wiring board 40 at a position where the power supply module 70 does not overlap the load 30 or the capacitor array 50 when viewed from the mounting surface of the wiring board 40. The inductors L may be mounted in the power supply module 70. The power supply module 70 may include the switching elements SW. The power supply module 70 may include the transformer TR.

In the case where the semiconductor composite device of the present disclosure includes the power supply module, the capacitor array may be included in a substrate of the power supply module.

Figure 47:
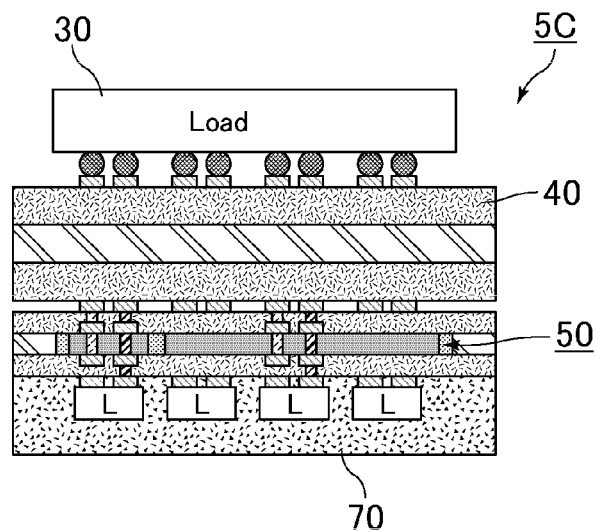
FIG. 47 is a cross-sectional view schematically illustrating an example of a semiconductor composite device including a capacitor array in a substrate of a power supply module.
Figure 48:
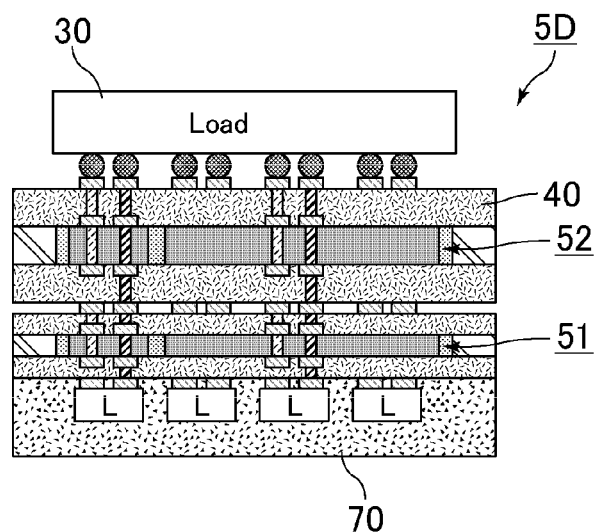
FIG. 48 is a cross-sectional view schematically illustrating another example of the semiconductor composite device including the capacitor array in the substrate of the power supply module.

FIG. 47 is a cross-sectional view schematically illustrating an example of a semiconductor composite device including the capacitor array in the substrate of the power supply module. FIG. 48 is a cross-sectional view schematically illustrating another example of the semiconductor composite device including the capacitor array in the substrate of the power supply module.

In a semiconductor composite device 5C illustrated in FIG. 47, the capacitor array 50 is included in a substrate of the power supply module 70.

In a semiconductor composite device 5D illustrated in FIG. 48, the first capacitor array 51 is included in the substrate of the power supply module 70, and the second capacitor array 52 is embedded in the wiring board 40.

In the semiconductor composite device in accordance with aspects of the present disclosure, the passive elements constituting the voltage regulator may include an inductor array including a plurality of inductors disposed in a plane.

Figure 49:
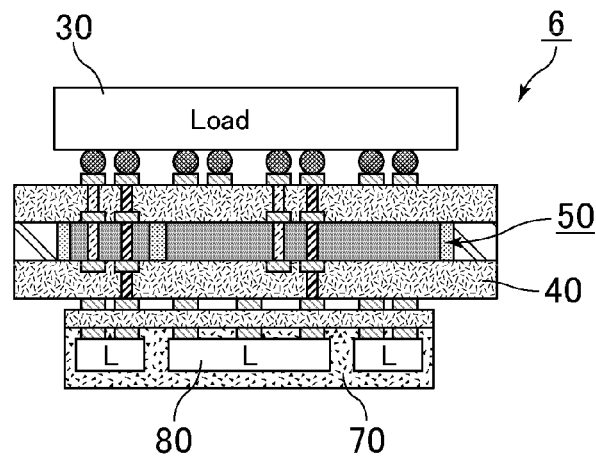
FIG. 49 is a cross-sectional view schematically illustrating an example of a semiconductor composite device including an inductor array.
Figure 50:
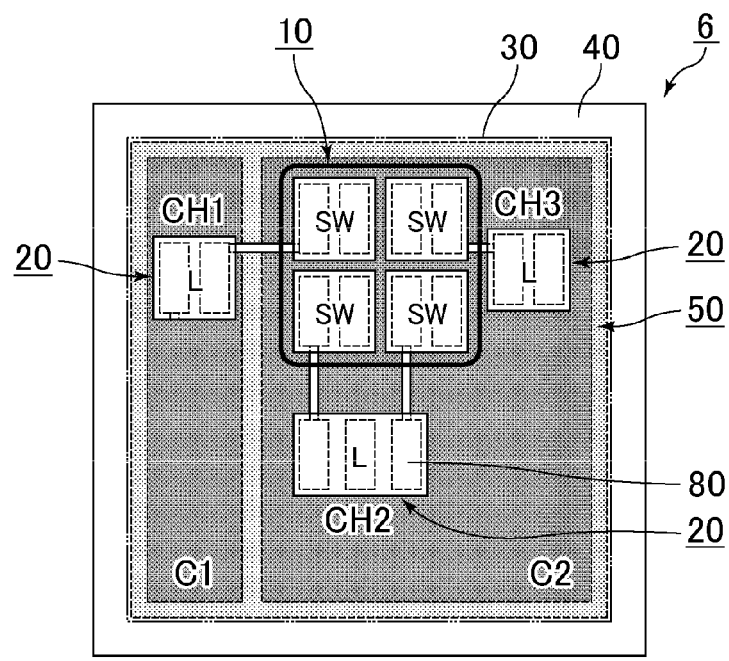
FIG. 50 is a plan view of the semiconductor composite device illustrated in FIG. 49 that is viewed from the other mounting surface of a wiring board.
Figure 51:
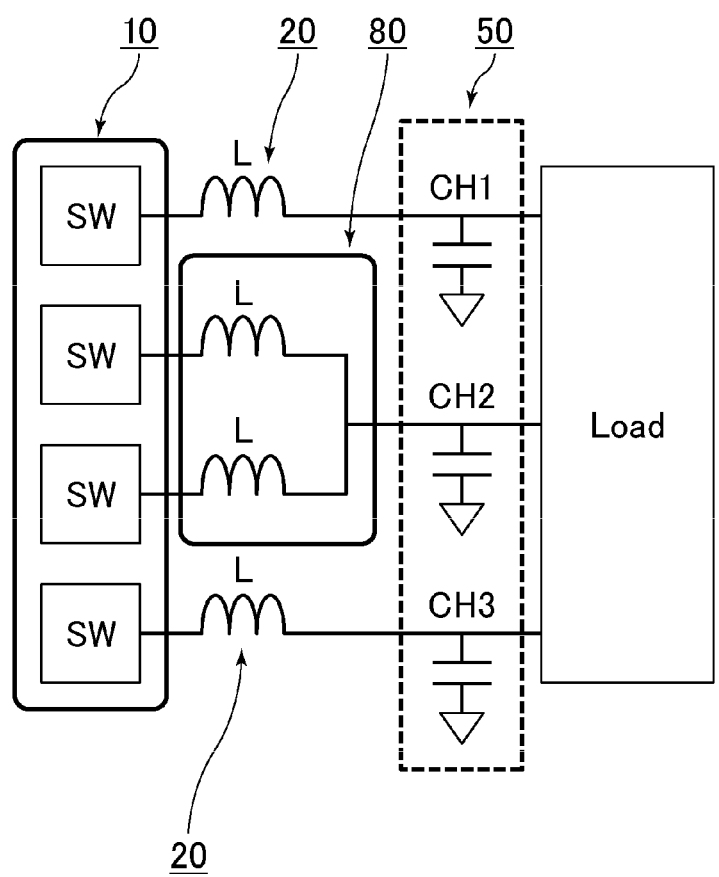
FIG. 51 is an example of a circuit structure diagram of the semiconductor composite device including the inductor array.

FIG. 49 is a cross-sectional view schematically illustrating an example of a semiconductor composite device including the inductor array. FIG. 50 is a plan view of the semiconductor composite device illustrated in FIG. 49 that is viewed from the other mounting surface of the wiring board. FIG. 51 is an example of a circuit structure diagram of the semiconductor composite device including the inductor array.

In a semiconductor composite device 6 illustrated in FIG. 49 and FIG. 50, the passive elements 20 include an inductor array 80. In the example illustrated in FIG. 50 and FIG. 51, the inductor array 80 is disposed in the second channel CH2. The inductor array 80 may be or may not be mounted in the power supply module 70. The semiconductor composite device 6 may not include the power supply module 70.

DESCRIPTION OF REFERENCE SYMBOLS 1, 2, 2A, 2B, 3, 4A, 4B, 4C, 4D, 4E, 4F, 4G, 4H, 5A, 5B, 5C, 5D, 6, 100 semiconductor composite device
10 active element
20 passive element
30, 30A load
31 semiconductor element
32 packaging substrate
40, 400 wiring board
45 circuit layer
50, 500 capacitor array
51 first capacitor array
52 second capacitor array
61, 610 first connection terminal
62, 620 second connection terminal
70 power supply module
80 inductor array
210 capacitor portion
211 positive terminal plate
212 core portion
214 porous portion
216 negative terminal layer
216A carbon layer
216B copper layer
220, 222 conductive portion
224 via conductor
230 insulating portion
230A first insulating portion
230B second insulating portion
230C third insulating portion
230D fourth insulating portion
240 positive terminal connection layer
240A first positive terminal connection layer
240B second positive terminal connection layer
242A first resin-filling portion
242B second resin-filling portion
410 core layer
420 wiring layer
430, 430A cavity
440 tape
450 insulating layer
460 via hole
470 first conductor portion
480 second conductor portion
490 through hole
CH1 first channel
CH2 second channel
CH3 third channel
C1, C2 output capacitor
L1, L2, L3, L4, L inductor
SW1, SW2, SW3, SW4, SW switching element
TH1, TH2 through hole conductor
TH11 first through hole conductor
TH12 second through hole conductor
TR transformer
h11 first through hole
h12 second through hole

The invention claimed is:

1. A semiconductor composite device comprising:
a voltage regulator including a plurality of active elements and a plurality of passive elements and arranged with a plurality of channels;
a load including a semiconductor element and configured to be supplied with a direct-current voltage and regulated by the voltage regulator; and
a wiring board electrically connected to the plurality of active elements, the plurality of passive elements, and the load,
wherein the active elements of the voltage regulator include switching elements,
wherein the passive elements of the voltage regulator include capacitors, and a plurality of the capacitors disposed in the plurality of channels comprise an integrally formed capacitor array comprising a plurality of capacitor portions disposed in a plane,
wherein the capacitor array comprises a plurality of through hole conductors extending through the capacitor array in a direction perpendicular to a mounting surface of the wiring board.

2. The semiconductor composite device according to claim 1, wherein at least a portion of the capacitor array is positioned to overlap the load when viewed from the mounting surface of the wiring board.

3. The semiconductor composite device according to claim 1, wherein the integrally formed capacitor array is connected to two or more channels out of the plurality of channels.

4. The semiconductor composite device according to claim 1, wherein the passive elements including the voltage regulator further includes inductors connected between the switching elements and the load,
wherein the inductors disposed in at least one of the channels are electrically connected to the through hole conductors extending through the capacitor array, and
wherein at least parts of the inductors electrically connected to the through hole conductors are positioned to overlap the capacitor array when viewed from the mounting surface of the wiring board.

5. The semiconductor composite device according to claim 4, wherein the through hole conductors connected to the inductors are connected to a positive terminal of the capacitor.

6. The semiconductor composite device according to claim 4,
wherein the channel in which the inductors are electrically connected to the through hole conductors constitutes a multi-phase power supply comprising a plurality of power supply circuits connected in parallel, wherein the through hole conductors connected to the inductors disposed in the respective power supply circuits constituting the multi-phase power supply are connected to a positive terminal of the capacitor, and wherein the plurality of through hole conductors connected to the respective inductors are electrically connected via the positive terminal of the capacitor.

7. The semiconductor composite device according to claim 4, wherein the inductors electrically connected to the through hole conductors are disposed opposite the load when viewed from the capacitor array.

8. The semiconductor composite device according to claim 7, wherein the inductors electrically connected to the through hole conductors are disposed on the mounting surface of the wiring board.

9. The semiconductor composite device according to claim 8, wherein, in the channel in which the inductors are electrically connected to the through hole conductors, at least parts of the switching elements are positioned to overlap the capacitor array when viewed from the mounting surface of the wiring board.

10. The semiconductor composite device according to claim 1, wherein at least one through hole conductor out of the through hole conductors extending through the capacitor array is connected to a positive terminal of the capacitor.

11. The semiconductor composite device according to claim 10, wherein the capacitor comprises a positive terminal plate made of a metal, and wherein the through hole conductor connected to the positive terminal of the capacitor is connected to an end surface of the positive terminal plate.

12. The semiconductor composite device according to claim 10, wherein the passive elements constituting the voltage regulator further comprise inductors connected between the switching elements and the load, and wherein the inductors disposed in at least one of the channels are electrically connected to the through hole conductor connected to the positive terminal of the capacitor.

13. The semiconductor composite device according to claim 1, wherein at least one through hole conductor out of the through hole conductors extending through the capacitor array is connected to a negative terminal of the capacitor.

14. The semiconductor composite device according to claim 1, wherein the capacitor array comprises the plurality of capacitor portions obtained by dividing a single capacitor sheet formed from an aluminum element.

15. The semiconductor composite device according to claim 1, wherein the capacitor array is embedded in the wiring board.

* * * * *